US010958032B2

(12) United States Patent
Price et al.

(10) Patent No.: US 10,958,032 B2
(45) Date of Patent: Mar. 23, 2021

(54) INCREASED SPECTRAL LINEWIDTH AND IMPROVED LASER CONTROL

(71) Applicant: MICROSOFT TECHNOLOGY LICENSING, LLC, Redmond, WA (US)

(72) Inventors: Raymond Kirk Price, Redmond, WA (US); Novela Kristim Auparay, Seattle, WA (US); Yarn Chee Poon, Sammamish, WA (US)

(73) Assignee: MICROSOFT TECHNOLOGY LICENSING, LLC, Redmond, WA (US)

( * ) Notice: Subject to any disclaimer, the term of this patent is extended or adjusted under 35 U.S.C. 154(b) by 207 days.

(21) Appl. No.: 16/290,666

(22) Filed: Mar. 1, 2019

(65) Prior Publication Data
US 2020/0280158 A1    Sep. 3, 2020

(51) Int. Cl.
G03B 21/20    (2006.01)
H04N 9/31     (2006.01)
H01S 3/00     (2006.01)
G02B 26/12    (2006.01)
(Continued)

(52) U.S. Cl.
CPC ............ H01S 3/0071 (2013.01); G02B 26/12 (2013.01); G03B 21/2053 (2013.01); H03K 5/04 (2013.01); H03K 7/08 (2013.01); H04N 9/3135 (2013.01); H04N 9/3155 (2013.01)

(58) Field of Classification Search
CPC .. G03B 21/2053; H01S 3/0071; H04N 9/312; H04N 9/3132; H04N 9/3135; H04N 9/3155; H04N 9/3161
See application file for complete search history.

(56) References Cited

U.S. PATENT DOCUMENTS

2003/0011751 A1    1/2003   Sakata et al.
2010/0265473 A1   10/2010   Yamashita et al.
(Continued)

FOREIGN PATENT DOCUMENTS

CN         102314055 A       1/2012

OTHER PUBLICATIONS

"Laser Linewidth—Wikipedia, The Free Encyclopedia", Retrieved From: https://web.archive.org/web/20111114232732/https://en.wikipedia.org/wiki/Laser_linewidth, Nov. 14, 2011, 3 Pages.
(Continued)

*Primary Examiner* — Ryan D Howard

(74) *Attorney, Agent, or Firm* — Workman Nydegger

(57) ABSTRACT

Techniques are provided for increasing a laser light's spectral linewidth while simultaneously improving how a laser is controlled by causing the laser to operate at higher power levels. An illumination energy value for a pixel and an illumination time period for the pixel are both determined. A number of laser pulses that are to be emitted by the laser assembly to illuminate the pixel during the illumination time period is also determined. This number is based on the illumination energy value for the pixel. Then, within the illumination time period and in accordance with the determined number of laser pulses, the pixel is illuminated by causing the laser assembly to emit one or more laser pulses that cause the pixel to be illuminated at the illumination energy value.

20 Claims, 16 Drawing Sheets

(51) Int. Cl.
*H03K 5/04* (2006.01)
*H03K 7/08* (2006.01)

(56) References Cited

U.S. PATENT DOCUMENTS

2013/0222774 A1* 8/2013 Chikaoka ............... G02B 27/48
 353/85
2016/0301905 A1 10/2016 Asada

OTHER PUBLICATIONS

"International Search Report and Written Opinion Issued in PCT Application No. PCT/US20/018931", dated Aug. 3, 2020, 20 Pages.

* cited by examiner

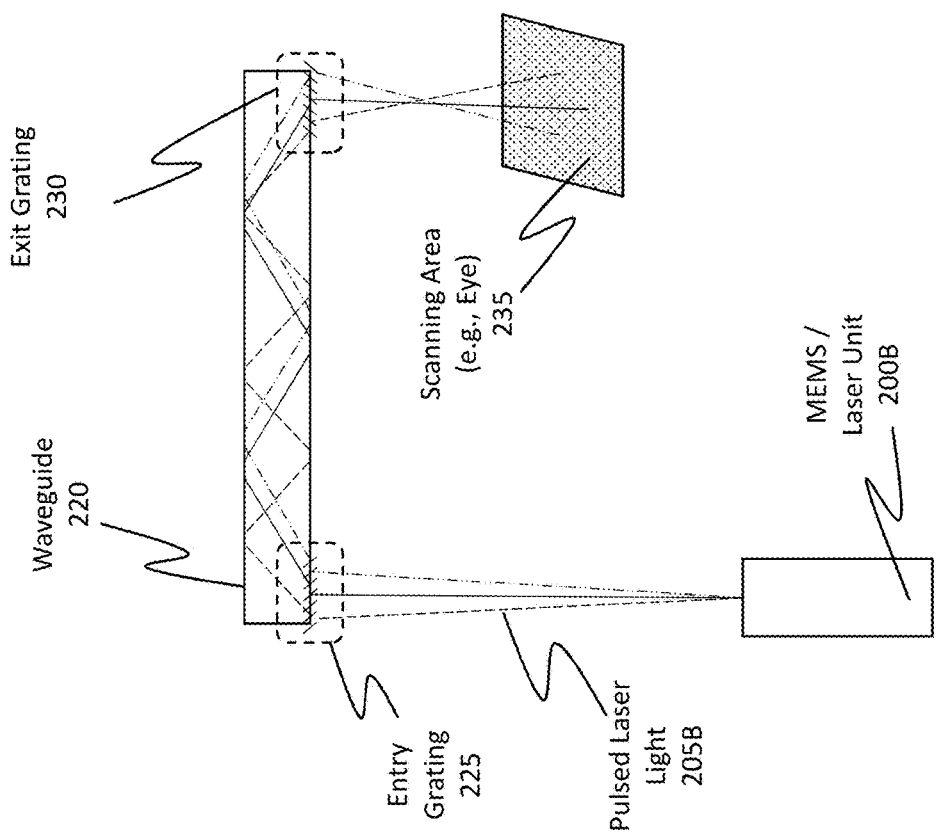
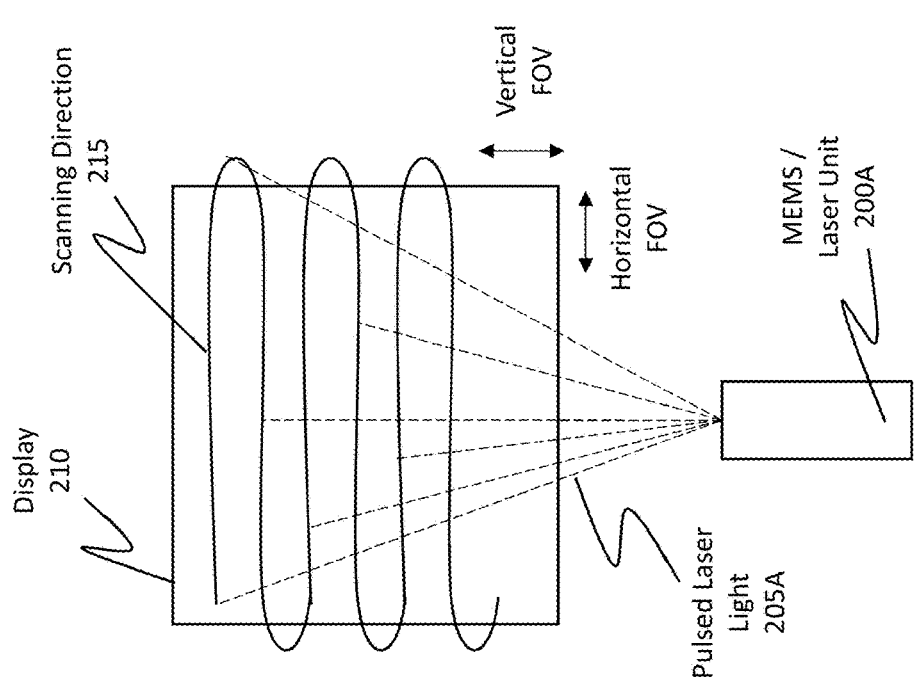

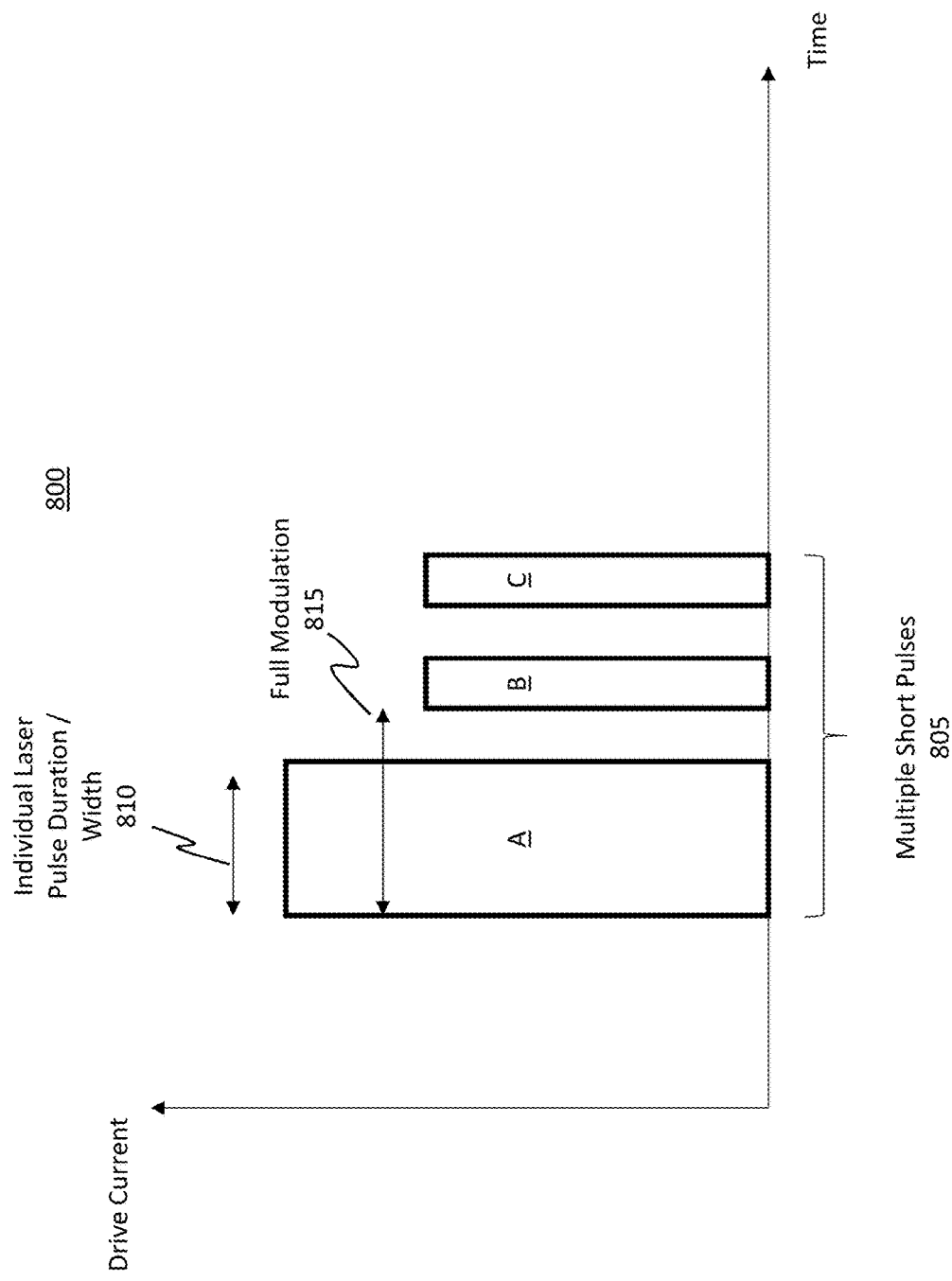

INCREASED SPECTRAL LINEWIDTH AND IMPROVED LASER CONTROL

BACKGROUND

Mixed-reality systems, including virtual-reality (VR) and augmented-reality (AR) systems, have received significant attention because of their ability to create truly unique experiences for their users. For reference, conventional VR systems create a completely immersive experience by restricting their users' views to only virtual environments. This is often achieved through the use of a head-mounted device (HMD) that completely blocks any view of the real world. As a result, a user is entirely immersed within the virtual environment. In contrast, conventional AR systems create an augmented-reality experience by visually presenting virtual images (i.e. "holograms") that are placed in or that interact with the real world.

As used herein, VR and AR systems are described and referenced interchangeably. Unless stated otherwise, the descriptions herein apply equally to all types of mixed-reality systems, which (as detailed above) include AR systems, VR systems, and/or any other similar system capable of displaying virtual images. As used herein, the term "virtual image" collectively refers to images rendered within a VR environment as well as images/holograms rendered in an AR environment.

Some of the disclosed mixed-reality systems use one or more on-body devices (e.g., the HMD, a handheld device, etc.). The HMD provides a display that enables a user to view overlapping and/or integrated visual information (e.g., holograms) in whatever environment the user is in, be it a VR environment, an AR environment, or any other type of environment. Continued advances in hardware capabilities and rendering technologies have greatly improved how mixed-reality systems render virtual images. Notwithstanding these advances, the process of immersing a user into a mixed-reality environment creates many challenges, difficulties, and costs, particularly with regard to providing high-quality virtual images to the user and to controlling the laser emitter(s)/assembly(s) used to generate the virtual images. As used herein, the terms "laser," "laser emitter," and "laser assembly" are interchangeable with one another.

For instance, methodologies are in place to use a red, green, blue (RGB) laser assembly to visually project one or more virtual images for the user to view and interact with while immersed in a mixed-reality environment/scene. Often, however, the narrow spectral linewidth and high coherence of laser-based displays coupled with waveguide holographic gratings causes certain fringe image artifacts (e.g., Newton Rings) to be introduced into those virtual images due to forced attempts of using traditional lasers having suboptimal light coherence characteristics. Such imperfections/image artifacts can negatively impact the display quality and the user's experience.

Additionally, difficulties arise when the laser assembly operates at low or lower power intensities. These difficulties arise as a result of misestimating or miscalculating the laser assembly's lasing current threshold. For instance, when the laser operates at or near the lasing current threshold, any miscalculations in that lasing current threshold will significantly impact the accuracy of color rendering of the display because the laser will not deliver the correct number of photons for accurate color intensity. From this, it will be appreciated that there is a substantial need to improve virtual image quality by reducing undesired fringe image artifacts.

There is also an ongoing need to provide techniques for controlling operation of the laser assembly(s), at various output power levels.

The subject matter claimed herein is not limited to embodiments that solve any disadvantages or that operate only in environments such as those described above. Rather, this background is only provided to illustrate one exemplary technology area where some embodiments described herein may be practiced.

BRIEF SUMMARY

Embodiments disclosed herein relate to systems, methods, and devices that can be used to improve how virtual images are rendered and that can also be used to improve how a laser is controlled. Such improvements, for example, can be achieved (as discussed herein) by operating lasers using ultra-short laser pulses and at relatively high or higher power outputs.

Some embodiments operate a display system in a manner so as (i) to reduce an impact of a lasing current threshold misestimation error for a laser assembly by selectively controlling how many laser pulses the laser assembly emits to illuminate a particular pixel as well as by operating the laser assembly at higher power output levels and/or (ii) to increase a spectral linewidth and reduce coherence of laser light emitted by the laser assembly so as to reduce the occurrence of undesired visual artifacts by emitting pulses having ultra-short durations. In some cases, this is achieved by determining or dynamically setting the pulse width for each of the pulses for each pixel. To do so, an illumination energy value for a pixel of an image frame is determined. Additionally, an illumination time period for the pixel is determined. The illumination time period defines a maximum period of time during which the pixel is permitted to be illuminated by the laser assembly. A number of laser pulses that are to be emitted by the laser assembly to illuminate the pixel during the illumination time period is also determined. Here, the number of laser pulses is based on the illumination energy value for the pixel. Then, within the illumination time period and in accordance with the determined number of laser pulses, the pixel is illuminated by causing the laser assembly to emit one or more laser pulses that are directed towards the pixel and that cause the pixel to be illuminated at the illumination energy value.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Additional features and advantages will be set forth in the description which follows, and in part will be obvious from the description, or may be learned by the practice of the teachings herein. Features and advantages of the invention may be realized and obtained by means of the instruments and combinations particularly pointed out in the appended claims. Features of the present invention will become more fully apparent from the following description and appended claims, or may be learned by the practice of the invention as set forth hereinafter.

BRIEF DESCRIPTION OF THE DRAWINGS

In order to describe the manner in which the above-recited and other advantages and features can be obtained, a more particular description of the subject matter briefly described above will be rendered by reference to specific embodiments which are illustrated in the appended drawings. Understanding that these drawings depict only typical embodiments and are not therefore to be considered to be limiting in scope, embodiments will be described and explained with additional specificity and detail through the use of the accompanying drawings in which:

FIG. 2A illustrates an example of a MEMS/laser system being used in a VR system having a display, and FIG. 2B illustrates an example of a MEMS/laser system being used in an AR system having a diffraction grating waveguide-based display.

FIGS. 8A and 8B illustrate additional techniques of emitting ultra-short laser pulses and how the laser is fully modulated between each ultra-short laser pulse.

DETAILED DESCRIPTION

Figure 1:
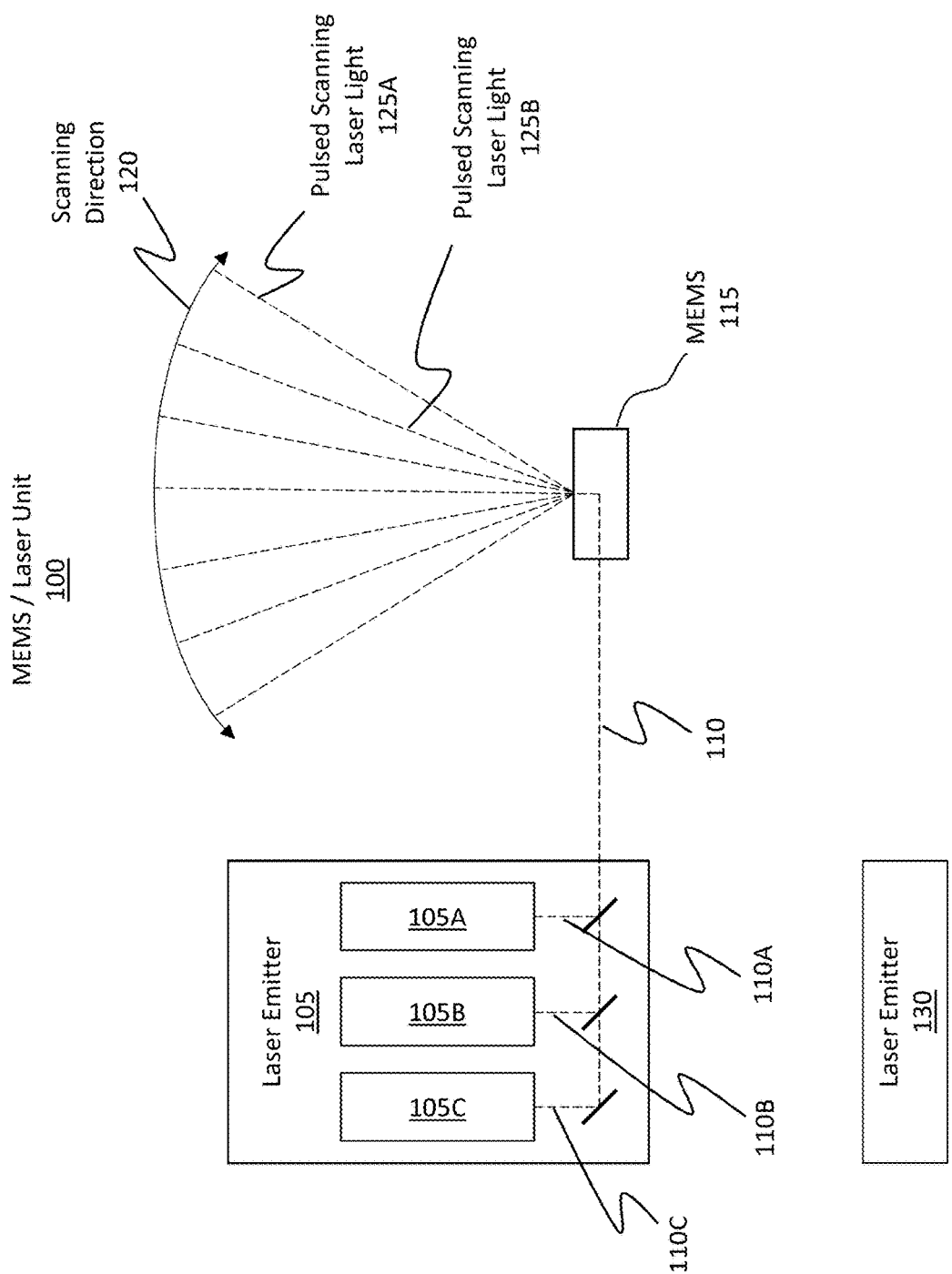
FIG. 1 illustrates how, when a microelectromechanical scanning (MEMS) mirror system is used in conjunction with a laser assembly, any number of virtual images may be rendered in a mixed-reality system.

Embodiments disclosed herein relate to systems, methods, and devices that beneficially increase a laser light's spectral linewidth and spatial coherence using ultra-short laser pulses while simultaneously improving how a laser is controlled by causing the laser to operate at high or higher power levels that are distant (e.g., a predetermined amount) from its lasing current threshold.

To do so, an illumination energy value for a pixel and an illumination time period for the pixel are both determined, where the illumination time period may be different that a pulse duration for a laser pulse. A number of laser pulses that are to be emitted by the laser assembly to illuminate the pixel during the illumination time period is also determined. This number is based on the illumination energy value for the pixel. The laser assembly beneficially generates ultra-short laser pulses and operates at a higher power output to thereby achieve larger spectral linewidths and improved control of the laser (e.g., by operating further away from the lasing current threshold). The number and pulse duration of these ultra-short laser pulses is designed to achieve the desired illumination energy value for the pixel. Then, within the illumination time period and in accordance with the determined number of laser pulses, the pixel is illuminated by causing the laser assembly to emit one or more ultra-short laser pulses that cause the pixel to be illuminated at the illumination energy value, thereby achieving broad spectral linewidth, reduced turn-on delay for the laser assembly, and improved power output control of the laser assembly.

Technical Benefit(s)

The disclosed embodiments bring about substantial benefits to the technical field. Specifically, with MEMS scanning systems that use waveguides to direct and project laser light, it is often the case that undesired fringe artifacts occur in the resulting virtual images due to matched coherence properties of the laser and the surface relief grating waveguides. The disclosed embodiments reduce or even entirely eliminate the occurrence of these undesired artifacts by increasing the spectral linewidth and reducing spatial coherence of the laser light. Increasing the spectral linewidth causes the coherence level of the laser to be reduced, thereby resulting in better image quality for systems that use waveguides to propagate laser light.

The disclosed embodiments also improve the technical field by enabling easier control of the laser emitter/assembly. For instance, a display with a certain number (e.g., perhaps 512) different brightness intensities would require the ability to precisely know the threshold current and slope efficiency of the device, and to control the laser power over the entire number (e.g., in this case 512) of different brightness levels. For instance, in order for a laser to lase (i.e. produce laser light), the laser is required to operate at or above its lasing current threshold. Sometimes, however, the exact value for this lasing current threshold is often not known, as lasing current threshold and slope efficiency are dependent on device temperature and laser drive characteristics. In fact, the value is often estimated. It is often the case that there is a misestimation or miscalculation error in determining the lasing current threshold. When the laser operates at lower power levels near the lasing current threshold, any errors from the misestimation significantly impact the performance of the laser (e.g., the laser might not even lase).

Additionally, it is simply more difficult to operate the laser at lower power levels that are nearer the lasing current threshold. To resolve these issues, the disclosed embodiments beneficially modify the power output of the laser so that the laser operates at higher power levels further removed from the lasing current threshold (e.g., by a predetermined amount or percentage away from the lasing current threshold). In doing so, any misestimation errors in the lasing current threshold calculation will have a substantially smaller impact on the laser's performance because the laser is not operating near the boundary or threshold.

Additionally, operating the laser assembly at high or higher power output levels results in a smaller turn-on delay for the laser assembly, which is also highly beneficial. To operate the laser assembly at the higher power levels, the disclosed embodiments cause the laser to emit one or more ultra-short laser pulses, as will be discussed in more detail later. Accordingly, the disclosed embodiments bring about many real and substantial benefits to the technical field.

Mixed-Reality Systems

FIG. 1 shows some components that may be included within a display for a mixed-reality computing system. These components are beneficially provided to render the virtual images that were discussed earlier. Specifically, FIG. 1 shows a MEMS/laser unit 100 that includes a laser emitter 105 which functions as a projector for the mixed-reality display.

Laser emitter 105 (or laser assembly) includes a (first) laser 105A, a (second) laser 105B, and a (third) laser 105C. Examples of these lasers may be a red laser, a green laser, and a blue laser such that the laser emitter 105 is a red, green, blue (RGB) laser assembly having RGB lasers. While only three lasers are presently shown, it will be appreciated that laser emitter 105 may include any number of lasers. Moreover, in some embodiments, lasers 105A, 105B, and 105C may be included within their own different discrete laser assemblies. In some embodiments, an infrared (IR) laser may be included as a part of laser emitter 105 or within a separate assembly/emitter.

In some embodiments, such as the one shown in FIG. 1, the laser light from the lasers 105A, 105B, and 105C is optically/spectrally combined to form RGB laser light 110. That is, the laser light 110A from laser 105A, the laser light 110B from laser 105B, and the laser light 110C from laser 105C is optically/spectrally combined (e.g., either within the laser emitter 105 or outside of the laser emitter 105) to produce a single collimated beam of red, green, and blue laser light 110. It will be appreciated that laser light 110 may be a continuous beam of laser light, or, alternatively, it may be a pulsed beam of laser light. In the example shown in FIG. 1, the laser light 110 is a pulsed beam, as demonstrated by its dashed-line illustration.

The laser light 110 is then directed to a microelectromechanical scanning ("MEMS") mirror system 115. The MEMS mirror system 115 includes a multi-directional mirror array that is able to rapidly redirect and aim laser light to any desired pixel location. For example, scanning direction 120 shows how the MEMS mirror system 115 is able to rapidly redirect pulsed (or continuous) scanning laser light 125A and pulsed scanning laser light 125B to any location. Here, pulsed scanning laser light 125A and 125B originate from the laser light 110. While only two instances of the pulsed scanning laser light (e.g., 125A and 125B) are labeled, it will be appreciated that the MEMS mirror system 115 is able to redirect any number of pulsed emissions. By scanning laser light back and forth horizontally and up and down vertically, the MEMS/laser unit 100 is able to illuminate individual pixels of a virtual image within a desired field of view. Because the MEMS/laser unit 100 is able to illuminate individual pixels so rapidly, the MEMS/laser unit 100 is able to render an entire virtual image (e.g., an image frame) for a user to view and interact with without the user realizing that the virtual image was progressively generated by scanning individual pixels.

In some embodiments, the MEMS/laser unit 100 includes more than one laser emitter. For instance, FIG. 1 shows a (second) laser emitter 130. In cases where there are more than one laser emitter, then the emitters can be configured to jointly or concurrently illuminate pixels to generate an image frame. For instance, in some embodiments, an image frame is illuminated by two separate laser emitters (e.g., laser emitter 105 and laser emitter 130). In some cases, the two separate laser emitters concurrently illuminate corresponding pixels. In other cases, the two separate laser emitters stagger when pixels are illuminated.

FIGS. 2A and 2B further expand on this concept by showing how a MEMS/laser unit 200A can be used in a VR environment and how a MEMS/laser unit 200B can be used in an AR environment, respectively. MEMS/laser units 200A and 200B are both example implementations of the MEMS/laser unit 100 from FIG. 1. Pulsed laser light 205A in FIG. 2A and pulsed laser light 205B in FIG. 2B are example implementations of laser light 110 and pulsed scanning laser light 125A and 125B from FIG. 1.

In FIG. 2A, the display 210 is representative of a VR display. As described earlier, in a VR environment, the user's view of the real-world is entirely occluded such that the user is able to see only the VR environment. Here, display 210 is shown as including a vertical field of view ("FOV") and a horizontal FOV. FIG. 2A also shows the progressively backward and forward horizontal and upward and downward vertical scanning direction 215 in which the MEMS/laser unit 200A is able to scan individual images of a virtual image onto the display 210. By rapidly scanning/rastering the individual pixels, the MEMS/laser unit 200A is able to render an entire virtual image or even an entire VR environment.

Building on the earlier discussion, it will be appreciated that each pixel rastered on the display 210 is generated by pulsing the laser included within the MEMS/laser unit 200A. In this manner, it is possible to illuminate each pixel on display 210 in a pixel-by-pixel basis all the way from the top portion of the display 210 to the bottom portion of the display 210. Consequently, as the MEMS mirror system in the MEMS/laser unit 200A is scanned/aimed at a given pixel position on the display 210, the laser is pulsed to a determined intensity or power output level so as to properly illuminate that pixel within the overall virtual image. The intensity or brightness of the pixel is referred to herein as the "illumination energy" (or illumination energy value) for the pixel. As will be discussed in further detail later, a pixel's illumination energy is a function of the laser's output power and a laser pulse's pulse duration.

FIG. 2B shows an example implementation within an AR system. Instead of scanning pixels on a display (e.g., display 210), the AR system causes its MEMS/laser unit 200B to scan pixels onto the user's eye through the use of a waveguide 220, which receives the laser light and then directs the laser light towards the user's eye.

To illustrate, FIG. 2B shows the MEMS/laser unit 200B generating pulsed laser light 205B which is directed towards the waveguide 220. This waveguide 220 includes an entry grating 225, through which the pulsed laser light 205B enters the waveguide 220, and an exit grating 230, through which the pulsed laser light 205B exits the waveguide 220. The waveguide 220 is structured to enable the pulsed laser light 205B to propagate through it so that the pulsed laser light 205B can be redirected to a desired location, such as the scanning area 235. In many instances, the scanning area 235 corresponds to a user's eye. In this regard, there is a display module (e.g., the MEMS/laser unit 200B) that shines light into a waveguide (e.g., waveguide 220). Light is then refracted/reflected along that waveguide and then coupled out of the waveguide towards the user's eye. As such, instead of scanning light onto the display 210 in the VR scenario, pulsed laser light can be scanned to a user's eye in the AR scenario. Similar to the earlier discussion, the intensity or brightness of a pixel is referred to herein as the illumination energy for that pixel.

Figure 3:
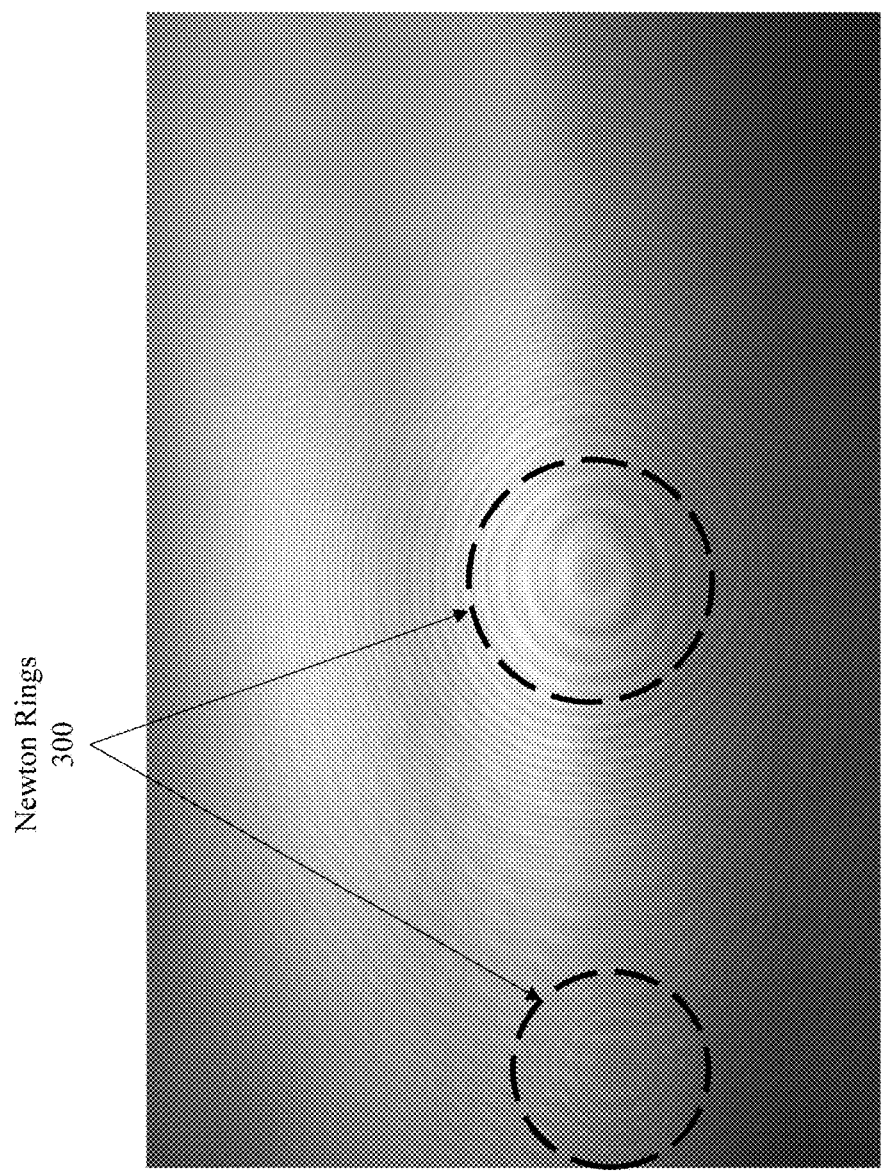
FIG. 3 illustrates an example of an undesired visual artifact (e.g., a Newton Ring) that may occur as a result of using laser light having a too narrow spectral linewidth.

In some instances, the disclosed waveguide is embedded with diffraction gratings that diffract the incident light onto the waveguide and towards the user's eye. Diffraction gratings are inherently sensitive to the spectral characteristics of the illumination source. These types of devices are often highly dependent on the input wavelength and spectral characteristics of the incoming light. Due to the characteristics of the disclosed waveguide, if a spectrally narrow beam of laser light were used (i.e. laser light with a smaller spectral linewidth), the resulting image will have many fringe image artifacts due to constructive and destructive interference effects of the coherent laser light (e.g., Newton Rings). An example of an undesired visual artifact is shown in FIG. 3 in the form of Newton Rings 300. These visual artifacts can be eliminated by broadening out/increasing the spectral linewidth of the laser light. Stated differently, if a broader range of wavelengths are included in the pulsed beam of laser light, more dispersion will result. This dispersion will beneficially lead to a more uniform virtual image resulting in less or no fringe image artifacts.

Additionally, given a horizontal MEMS resonance frequency and a vertical field of view refresh rate (or rather, a refresh rate in the vertical direction), one factor that defines the overall resolution of the resulting virtual image is dependent on how fast the laser device can be pulsed. That is, the faster the laser can be actively pulsed, a larger number of pixels can be scanned within the same FOV, thereby resulting in virtual images with higher resolution and less artifacts.

Accordingly, it is desirable to design a system that achieves (1) a broadened spectral linewidth for the pulsed beam of laser light by pulsing ultra-short laser pulses and (2) improved control of the laser emitter/assembly by operating the laser emitter at higher power levels away from the lasing current threshold to reduce the impact of any lasing current threshold misestimations or miscalculations. By designing a system that achieves both of these objectives, the quality of the resulting virtual images will be substantially improved and the ability to control the laser emitter will be made significantly easier.

Lasing Current Threshold

Figure 4A:
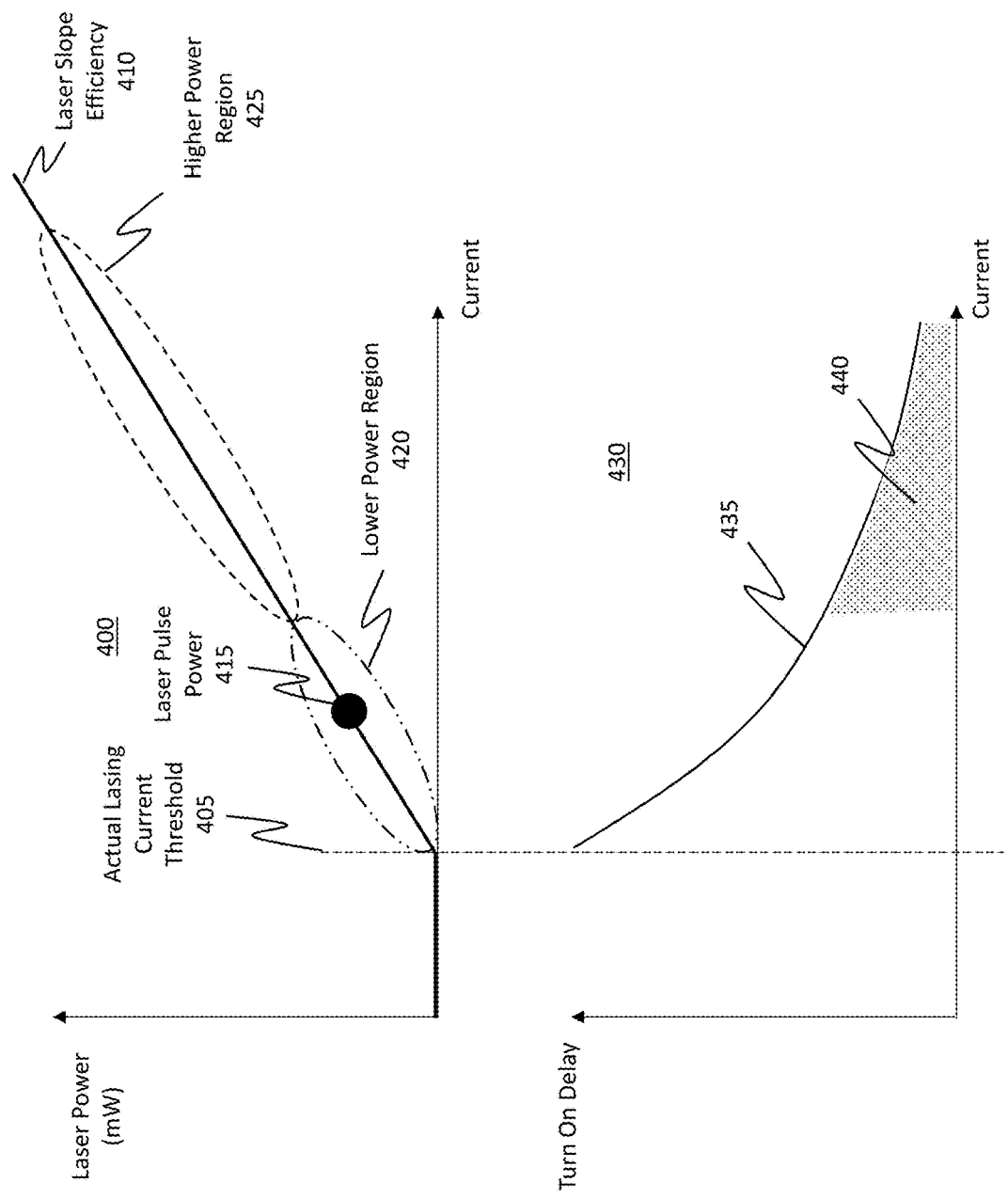
FIG. 4A illustrates a first graph showing a linear relationship between laser power and current and a second graph showing a relationship between turn-on delay and current.

FIG. 4A shows a graph 400 illustrating the functional relationship between laser power (in mW) and current. On graph 400, there is a point, referred to as the actual lasing current threshold 405, where the laser will begin to lase. Once the laser begins to lase, then graph 400 shows the trajectory of the laser's output power in the form of laser slope efficiency 410, which is typically a linear trajectory and illustrates the relationship between laser output power and input pump/drive current (i.e. the current indication on the x-axis).

If the actual lasing current threshold 405 is not satisfied (as shown by the left-hand side of that point), then the laser will not have sufficient drive current and the laser will not lase. On the other hand, if the laser's output current or power levels meet or exceed the actual lasing current threshold 405, then the laser will have sufficient drive current and the laser will lase, as shown by the laser slope efficiency 410. To be more precise, slope efficiency is defined as the change in power versus the change in current (e.g., dP/dI). It will be appreciated that laser slope efficiency 410 is referring to the slope of the line as opposed to a particular point on graph 400. Graph 400 also shows an example laser pulse power 415 that may be used to illuminate a particular pixel. It will be appreciated that the laser pulse power 415 may be different for each pixel, depending on the desired characteristics of the corresponding virtual image. Recall, the intensity or brightness of a particular pixel is based on its illumination energy, which itself is a function of laser pulse power and pulse duration.

Graph 400 also shows a lower power region 420 and a higher power region 425. Of course, these are symbolic regions provided for example purposes only and should not be considered limiting or otherwise binding.

As shown, the lower power region 420 is nearer to the actual lasing current threshold 405 while the higher power region 425 is further removed from the actual lasing current threshold 405. The higher power region 425 may be a predetermined amount of pump/drive current or percentage away from the actual lasing current threshold 405. As will be discussed in more detail later, any misestimations of the actual lasing current threshold 405 will have a larger impact on the laser when the laser operates within the lower power region 420 (i.e. when the laser's output power is within the lower power region 420) as compared to when the laser operates within the higher power region 425.

With traditional lasers, there are a few undesirable outcomes that may occur when those lasers are used with a waveguide-based scanning display. In particular, there can be a substantial amount of turn-on delay associated with the amount of time it takes between when the laser device is initially biased and when photons are actually coupled to the resonant cavity. This time delay is in the range of 0.25 ns to 10 ns, depending on the drive conditions of the laser. This time delay results in the laser device not being able to emit a laser beam until the photon density in the laser's resonant cavity is sufficiently high. This delay also results in the laser device not being able to raster as many pixels, thereby causing the virtual image to have a reduced resolution. This is especially significant for high resolution displays with pixel times, or rather pixel illumination durations, in the 5 ns range.

Graph 430 shows the functional relationship between turn-on delay and driving/pumping current. The line 435 corresponds to the turn-on delay for a laser device. As shown, when the input current is lower (i.e. nearer the actual lasing current threshold 405), there can be a substantial amount of turn-on delay (e.g., 5-6 nanoseconds). By following the disclosed principles (which will be discussed in more detail later), it is possible to significantly reduce this turn-on delay by causing the laser device to operate within the higher power region 425 shown by the dotted area 440. The disclosed embodiments have achieved turn-on delays of substantially less than 1 nanosecond. That is, by operating in the dotted area 440, significant reductions in turn-on delay may be achieved.

Figure 4B:
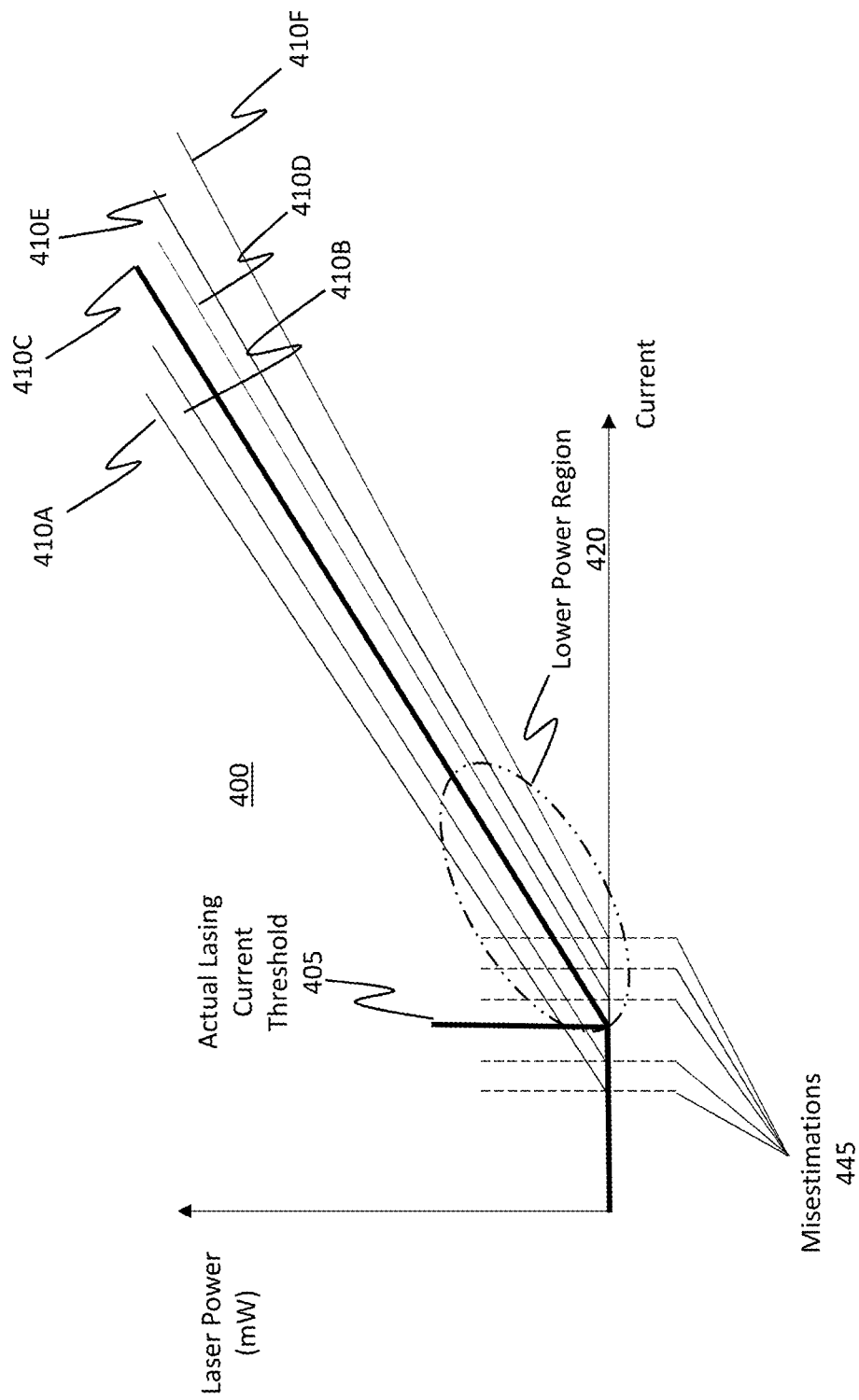
FIG. 4B illustrates how misestimations in computing the lasing current threshold can significantly impact laser performance, especially when the laser is operating at low or lower power levels.

FIG. 4B again shows graph 400, the actual lasing current threshold 405, and the lower power region 420. FIG. 4B additionally shows a number of additional laser slope efficiencies 410A, 410B, 410C, 410D, 410E, and 410F along with corresponding misestimations 445. To clarify, when operating a laser emitter, it is often the case that the actual lasing current threshold 405 is not perfectly known. Consequently, it is often the case that an estimation is performed to predict or estimate the actual lasing current threshold 405. These estimations are symbolically represented by laser slope efficiencies 410A-410F.

It should be noted that the threshold current and slope efficiency are dependent on the junction temperature of the laser device. Furthermore, the temperature of the laser device can change depending on frame content (e.g., how bright or intense an image frame is, such as by projecting highly illuminous content or a large amount of content) and/or depending on the duration of the image frame. As a consequence, the impact of any misestimation errors can vary and change over the display frame.

Often, errors are present in these estimations, resulting in any number of misestimations 445 in which there is a discrepancy between a modeled, predicted, or estimated determination of the lasing current threshold and the actual lasing current threshold 405. While the impact of these misestimations 445 is relatively reduced when the laser operates in the higher power region 425, the impact of these misestimations 445 can be particularly pronounced when the laser operates in the lower power region 420 (e.g., because the laser is operating closer to the actual lasing current threshold 405, thereby resulting in a larger impact).

Figure 5:
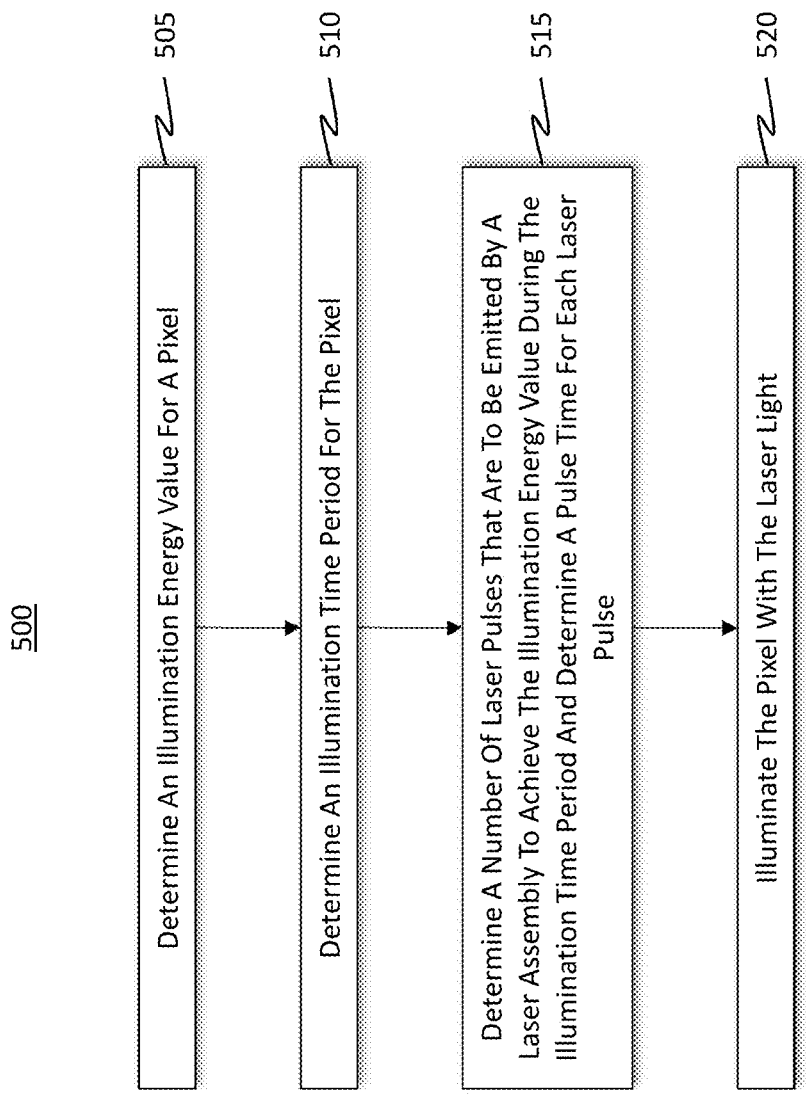
FIG. 5 illustrates a flowchart of an example method for operating a display system to reduce an impact of a lasing current threshold misestimation error while also increasing the spectral linewidth of laser light.

Accordingly, attention will now be directed to FIG. 5 which refers to a number of methods and method acts that may be performed. Although the method acts may be discussed in a certain order or illustrated in a flow chart as occurring in a particular order, no particular ordering is required unless specifically stated, or required because an act is dependent on another act being completed prior to the act being performed.

Example Method(s)

FIG. 5 illustrates a flowchart of an example method 500 of operating a display system that includes a microelectromechanical scanning (MEMS) mirror system and a laser assembly. The display system is configured to illuminate pixels of an image frame within a mixed-reality system. Here, each pixel in the image frame is illuminated with one or more laser pulse(s) that are provided by the laser assembly and that are aimed by the MEMS mirror system and in which multiple pixels are combined to form the image frame.

In addition to illuminating pixels, method 500 is also operable to reduce an impact of a lasing current threshold misestimation error of the laser assembly. This is achieved by selectively controlling how many laser pulses the laser assembly emits to illuminate any particular pixel as well as by selectively controlling the laser's power output and the pulse duration. Additionally, this is achieved by controlling the pulse width of these pulses.

Even further, method 500 is operable to increase the spectral linewidth of laser light that is emitted by the laser assembly. By reducing or shortening laser pulse duration, the resulting laser light has a broader spectral linewidth, which is highly advantageous for eliminating undesired fringe artifacts.

In this regard, method 500 is at least able to beneficially achieve (i) a broadened spectral linewidth through the use of ultra-short pulsed beams of laser light and (ii) an improved operational control of the laser emitter/assembly by operating the laser emitter at higher power levels to reduce any impacts of lasing current threshold misestimations/miscalculations while still achieving the pixel's desired illumination energy. The embodiments also achieve a reduced turn on delay.

Initially, method 500 includes an act 505 of determining an illumination energy (or illumination energy value) for a pixel that is to be illuminated by the laser emitter. As an example, it may be desirable to illuminate a pixel at an illumination energy value anywhere in a range of 0.1 pico-Joules up to 30 pico-Joules. As an example, a device with 512 different intensity levels operating at 30 pico-Joules would result in a 0.58 pJ (e.g., 30/512) per intensity level operation. The illumination energy value ultimately determines the brightness/dimness of the pixel that is to be illuminated. For instance, virtual images that are bright and highly colored will have higher illumination energy values while virtual images that are darker and not as highly colored will have lower illumination energy values.

Method 500 also includes an act 510 of determining an illumination time period for the pixel during which the pixel is to be illuminated with laser light generated by the laser assembly. To clarify, the illumination time period defines a maximum amount or period of time that a pixel will be illuminated with laser light (e.g., defining a maximum period of time during which the pixel is permitted to be illuminated by the laser assembly). It will be appreciated that a pixel's illumination time period may be different than the pulse duration of a laser emission. For instance, as will be discussed in more detail later, a pixel may have an illumination time period of 4 nanoseconds. During this 4 nanosecond time period, the embodiments may emit one, two, three, four, or more than four pulses, where each pulse has its own corresponding pulse duration and where the combination of the pulse durations is set to not exceed the illumination time period. In this regard, the illumination time period will have some impact on the spectral linewidth of the resulting laser light, though the laser pulse's individual pulse duration will have a larger impact on its spectral linewidth.

In some cases, the illumination time period is between 4 nanoseconds and 10 nanoseconds (or sometimes between 3 nanoseconds and 15 nanoseconds). Recall, with a MEMS scanning mirror system, each individual pixel is illuminated with a pulse of laser light for a determined period of time. In some cases, a single pulse of light is used to illuminate the pixel during the illumination time period while in other cases, according to the disclosed embodiments, multiple pulses of light illuminate the pixel during the illumination time period. When the illumination time period elapses, then the next subsequent pixel is illuminated with laser light. Because the MEMS scanning mirror system is able to operate so quickly, the MEMS scanning mirror system is able to illuminate pixels on an individual basis, where the collection of these pixels results in an image frame being generated for a user to view and interact with.

Figure 6:
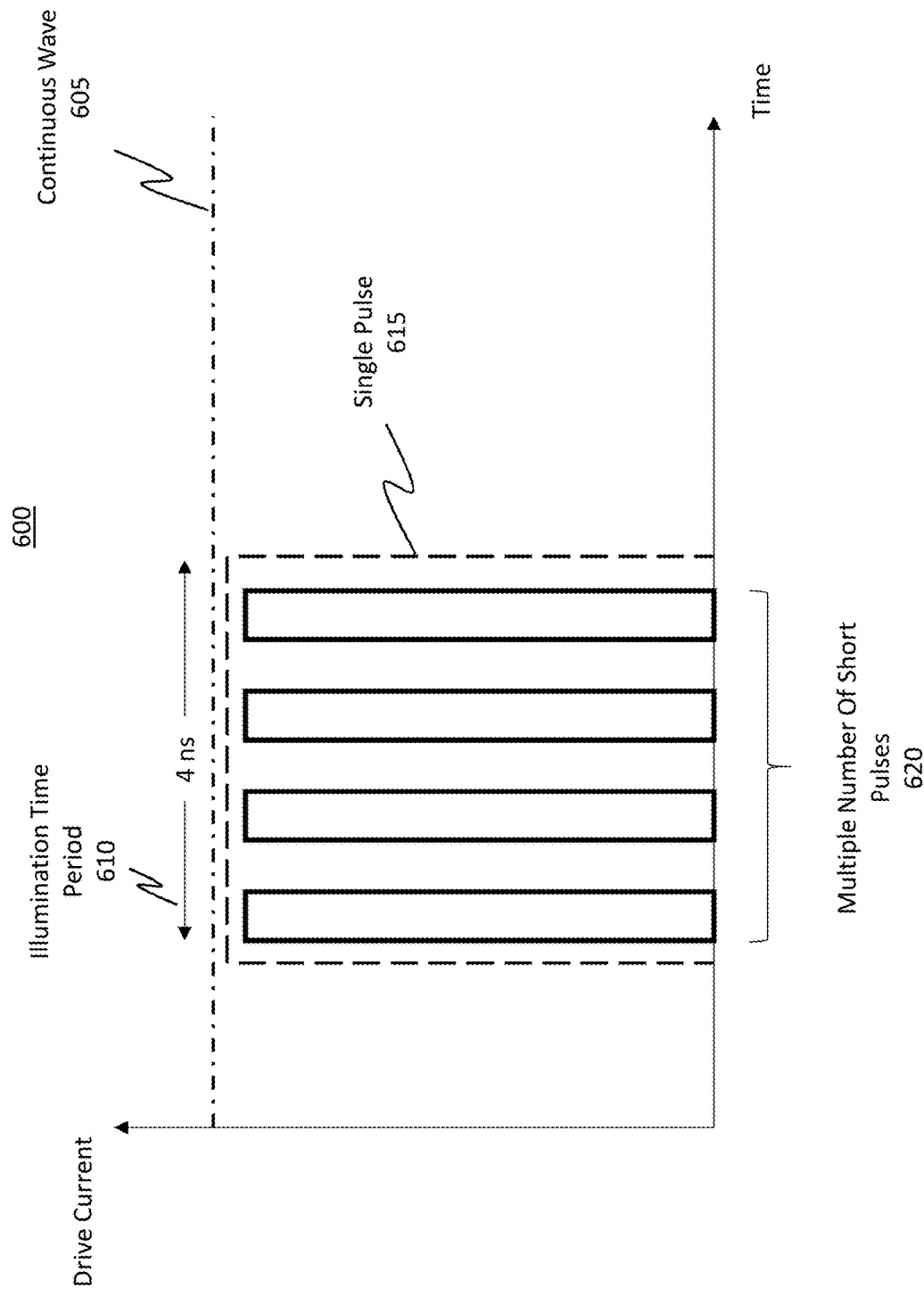
FIG. 6 illustrates an example technique of emitting ultra-short laser pulses to illuminate a pixel, where the ultra-short laser pulses results in the ability to better control the laser assembly and in the ability to increase spectral linewidth.

Method 500 then includes an act 515 of determining a number of laser pulses that are to be emitted by the laser assembly/emitter to achieve the illumination energy value during the illumination time period and to illuminate the pixel during the illumination time period. Additionally, this step may include a process of determining a pulse time for each laser pulse. That is, the embodiments are able to selectively control how long the laser pulses when illuminating a pixel. FIG. 6 will later provide additional detail on this aspect. Here, the number of laser pulses is based, at least in part, on the illumination energy value for the pixel.

In accordance with the disclosed embodiments, instead of operating the laser in a continuous manner or even instead of emitting a single pulse of laser light spanning the entire illumination time period, the disclosed embodiments are able to emit any number of ultra-short laser pulses during the illumination time period. It should be noted that the pulse duration for these ultra-short laser pulses is shorter than the overall illumination time period, even if only a single pulse is emitted.

As will be described in more detail later, the number of laser pulses that are to be emitted is based on a function of the desired illumination energy value for the pixel. For instance, a relatively larger illumination energy value for the pixel results in a relatively higher number of laser pulses being emitted during the illumination time period while a relatively lower illumination energy value for the pixel results in a relatively lower number of laser pulses being emitted during the illumination time period. Further detail on this feature will be provided later.

In some cases, during the illumination time period (e.g., between 4 nanoseconds and 10 nanoseconds or sometimes between 3 nanoseconds and 15 nanoseconds), any number of laser pulses may be emitted. Example numbers include, but are not limited to, between 1 laser pulse and 10 laser pulses during the illumination time period.

Subsequently, within the illumination time period and in accordance with the determined number of laser pulses, method 500 includes an act 520 of illuminating the pixel with the laser light by causing the laser assembly to emit one or more laser pulse(s) that are directed towards the pixel by the MEMS mirror system and that cause the pixel to be illuminated at the illumination energy value. Because the embodiments use ultra-short laser pulses, a spectral linewidth of the laser pulses is set to, or rather will be, at least a determined value (e.g., as a result of limiting the individual pulse durations for the laser pulses the spectral linewidths increase). Examples of pulse duration ranges for the ultra-short laser pulses will be presented later. Consequently, by emitting the ultra-short laser pulses, the corresponding spectral linewidths for the one or more laser pulse(s) are increased and fringe artifacts are eliminated, as will be discussed in more detail later.

FIG. 6 provides additional detail and context with regard to method 500. In particular, FIG. 6 shows a graph 600 plotting illumination time versus laser drive/pump current. When illuminating pixels, some traditional systems cause their lasers to emit a continuous wave 605 of laser light. In other traditional systems, an illumination time period 610 (e.g., 4 nanoseconds) is determined, and then those traditional systems emit a single short pulse 615 of laser light during the illumination time period 610, where the duration of the single short pulse 615 spans the entire or a majority of the illumination time period 610. While these traditional systems do have some benefits, the disclosed principles provide even greater benefits.

That is, according to the disclosed embodiments, a determined number (e.g., one, two, three, four, or any multiple) of ultra-short pulses 620 are emitted during the illumination time period 610. In the scenario shown in FIG. 6, four separate ultra-short laser pulses are shown as being emitted during the illumination time period 610. It should be noted that these multiple laser pulses are being emitted for the same pixel. To clarify, causing the laser assembly to emit the one or more laser pulse(s) (e.g., in FIG. 6, there are four laser pulses) includes causing the laser assembly to emit multiple laser pulses such that multiple pulses of laser light illuminate the same pixel during the illumination time period 610. Once the illumination time period 610 elapses, then a new pixel will be illuminated. The combination of all of the illuminated pixels results in an image frame rendered by the mixed-reality system.

As described earlier, the disclosed embodiments are able to selectively control the pulse duration for each individual pulse that is provided during illumination time period 610. For instance, the pulse duration or width for each one of the ultra-short pulses 620 can be selectively controlled. In some embodiments, a laser pulse duration of an ultra-short laser pulse (e.g., the one or more laser pulse(s) described in method 500 of FIG. 5) is between 0.4 nanoseconds and 3 nanoseconds. As such, an individual ultra-short laser pulse's duration is substantially shorter than the illumination time period for a pixel. As a result of emitting an ultra-short laser pulse (e.g., in the range of 0.4 nanoseconds to 3 nanoseconds), the spectral linewidth of these ultra-short laser pulses is increased or broadened. That is, as the laser pulse duration decreases, the spectral linewidth increases. An example is shown in FIG. 7A.

Figure 7A:
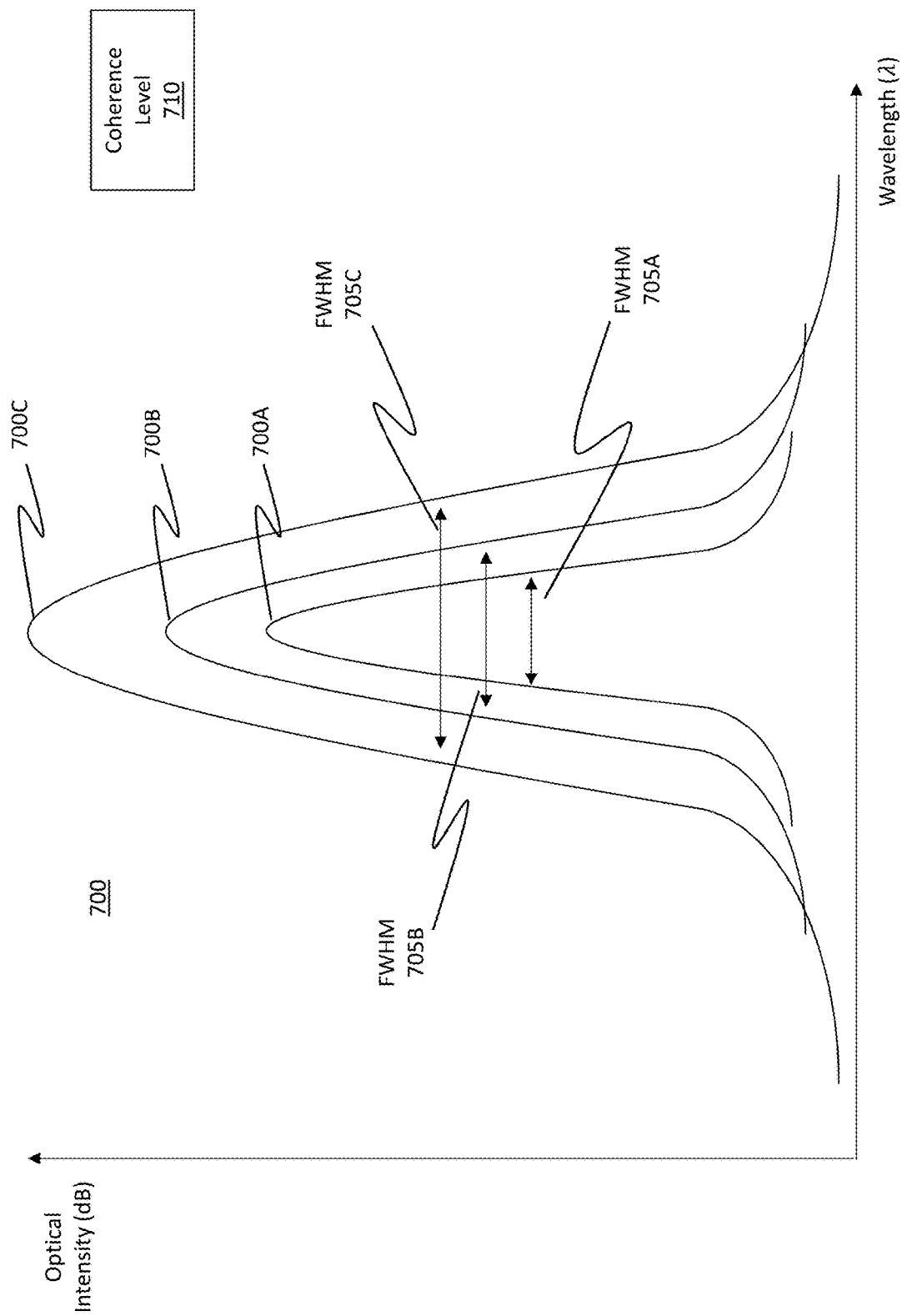
FIG. 7A illustrates how the spectral linewidth of laser light can be increased by operating the laser according to disclosed principles. The spectral characteristics are in arbitrary units and are represented linearly.

FIG. 7A shows a graph 700 plotting different spectral linewidths as a function of wavelength and optical intensity (e.g., in dB). Graph 700 includes three illustrations of laser light spectral linewidth in the form of spectral linewidths 700A, 700B, and 700C, including their corresponding full width at half maximum measurements (FWHM) 705A, 705B, and 705C, respectively.

FIG. 7A also shows the coherence level 710 of a laser. The term "coherence" generally relates to the capability of light to interfere with itself. To be perfectly "coherent," light from a light source is structured to have a definite phase relationship both in terms of electrical field values at different times and electrical field values at different positions. The term spatial coherence is used to describe the coherence of the laser light with itself over distance).

As the coherence level 710 decreases (i.e. as the laser light becomes less spectrally pure), it results in a widening or broadening of the laser light's spectral linewidth. In accordance with the disclosed embodiments, it is desirable to have a relatively broader spectral linewidth because this results in the elimination of undesired fringe image artifacts. That is, by broadening the spectral linewidth, the coherence level 710 is reduced and the amount of undesired visual artifacts created by a MEMS mirror scanning system with a waveguide is reduced, thereby improving the visual appearance of the resulting virtual images. In some embodiments, the coherence level 710, which is associated with the laser assembly, is a reduced coherence level occurring as a result of the laser assembly emitting one or more ultra-short laser pulse(s) (e.g., pulses having durations between the range of 0.4 nanoseconds and 3 nanoseconds) during the illumination time period as opposed to continuously emitting a continuous laser pulse during the illumination time period or a non-ultra-short laser pulse.

In some embodiments, a spectral linewidth of the laser pulses is also set to at least a determined value as a result of limiting the individual pulse durations for the laser pulses to the desired ultra-short pulse duration range. That is, by setting the pulse duration for each individual laser pulse to be within the ultra-short pulse duration, the embodiments are able to selectively control the spectral linewidths for those laser pulses. With reference to FIG. 7A, spectral linewidth 700A (i.e. a narrower spectral linewidth) corresponds to a longer laser pulse duration while spectral linewidth 700C (i.e. a broader spectral linewidth) corresponds to a shorter laser pulse duration.

In some embodiments, by emitting ultra-short laser pulses (e.g., in the range of 0.4 nanoseconds and 3 nanoseconds), the resulting spectral linewidth of these laser pulses is between 2 nanometers and 6 nanometers (or sometimes between 2 nanometers and 10 nanometers). In some embodiments, the spectral linewidth of the laser pulses is extended to be between 1 nanometer and 10 nanometers. Accordingly, the spectral linewidth increases as the pulse duration of the laser pulses decreases.

Figure 7B:
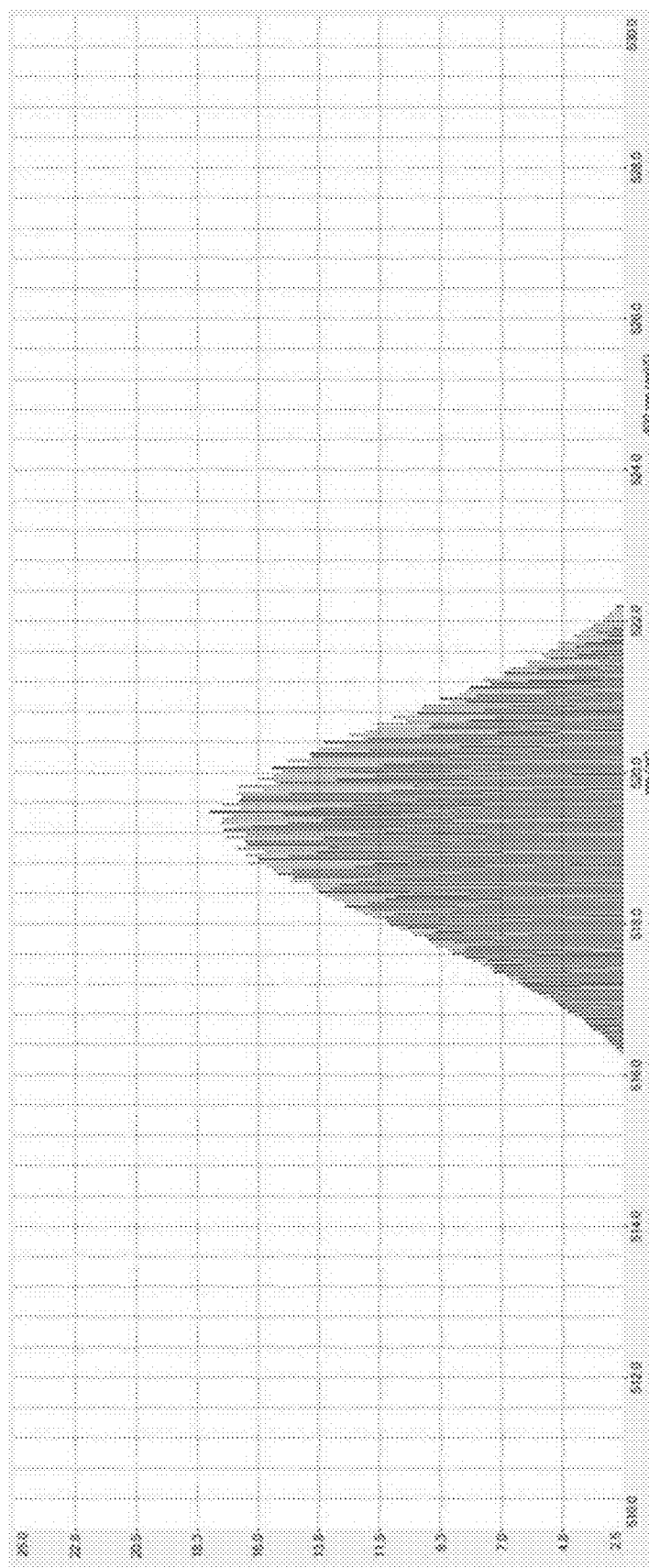
FIG. 7B illustrates some data showing how spectral linewidth and coherence are dependent on modulation frequency and/or pulse width.

Turning briefly to FIG. 7B, this figure provides a plot 715 illustrating the spectral linewidth and coherence of a laser beam that has a 500 MHz RF modulation and that has about a 1 ns pulse duration. As spectral linewidth increases, the coherence level decreases. In FIG. 7B, the spectral linewidth is relatively wide (i.e. the width of the plotted data is wider), resulting in the coherence being relatively lower. Accordingly, by emitting ultra-short pulse laser emissions, the disclosed embodiments are able to beneficially remove undesired visual artifacts. Accordingly, spectral linewidth and coherence are dependent on modulation frequency and/or pulse width.

Turning now to FIG. 8A, as described above, some embodiments are able to dynamically adjust the width or pulse duration of the laser pulses. FIG. 8A shows a graph 800 plotting drive/pump current as a function of time. Graph 800 shows multiple ultra-short pulses 805 (in this case three separate pulses, pulse A, pulse B, and pulse C) that are emitted during a single pixel's illumination time period. Each individual pulse width of the multiple laser pulses is adjustable and may be dependent on the illumination energy/intensity value. For instance, the individual laser pulse duration/width 810 for pulse A is larger than the pulse widths for pulses B and C. FIG. 8A also shows how illuminating the pixel with the multiple laser pulses results in the laser assembly being fully modulated for each one of the multiple laser pulses. Consequently, during a pixel's illumination time period, the laser assembly can be fully modulated (e.g., full modulation 815) any number of different times, where each modulation corresponds to a laser pulse.

Figure 8B:
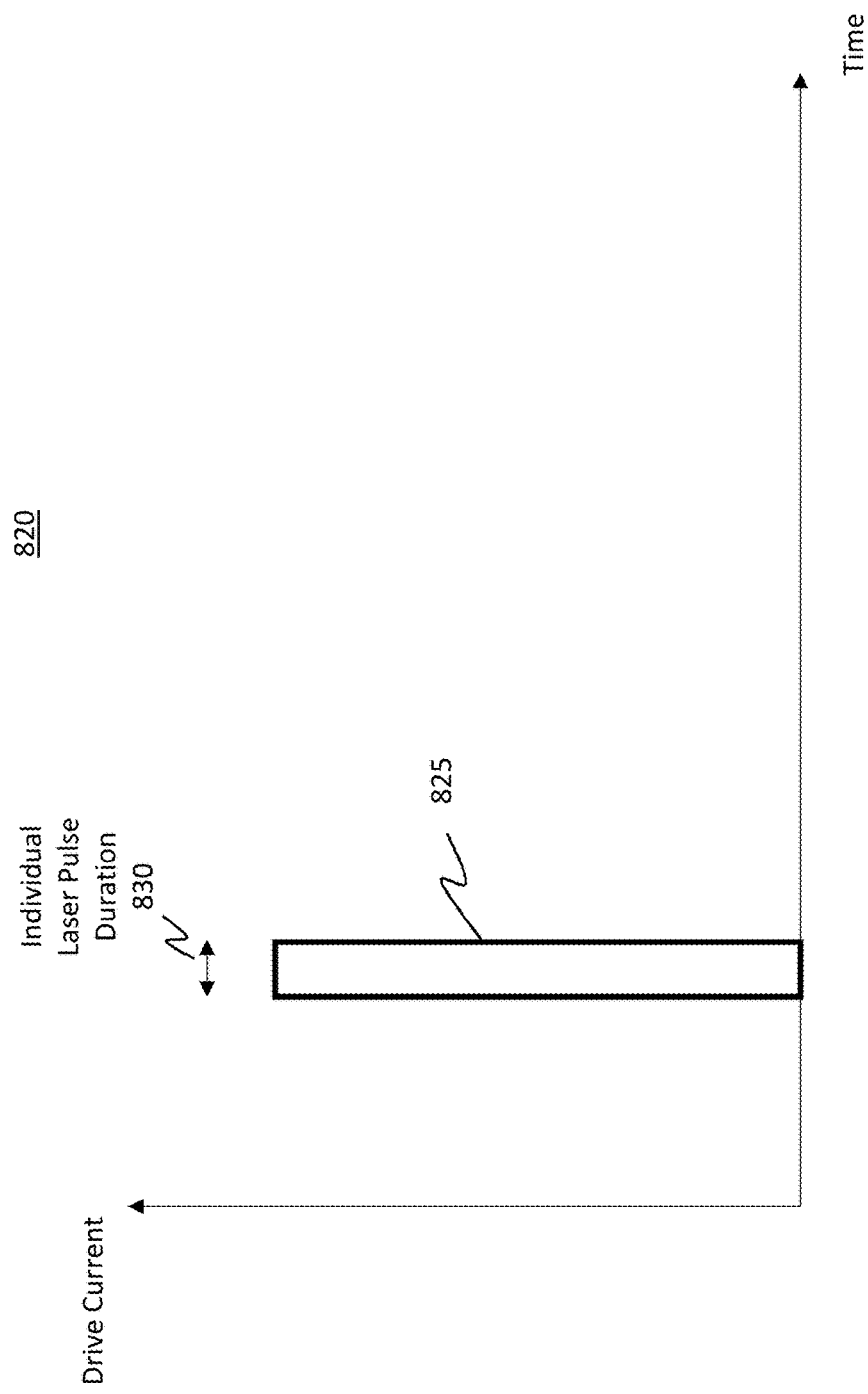

While FIG. 8A showed a scenario in which multiple ultra-short laser pulses were emitted, embodiments disclosed herein are also able to cause only a single ultra-short laser pulse to be emitted during a pixel's illumination time period, as shown in FIG. 8B. FIG. 8B shows another graph 820, similar to graph 800 of FIG. 8A. Here, however, only a single ultra-short laser pulse 825 is emitted. FIG. 8B also shows the individual laser pulse duration 830 for the single ultra-short laser pulse 825. It will be appreciated that the individual laser pulse duration 830 may be in the ultra-short ranges discussed earlier (e.g., between 0.4 nanoseconds and 3 nanoseconds).

Accordingly, the disclosed embodiments are able to dynamically alter the number of pulses that are emitted during a pixel's illumination time period. In some embodiments, the number of pulses emitted for a pixel is directly dependent on the desired illumination energy value for that pixel. At this point, some examples will be helpful.

As a first example, suppose a pixel is to be illuminated with 5 milli-Watts (mW) of laser output power over an illumination time period of 4 nanoseconds (ns), thereby resulting in an illumination energy value of 20 pico-Joules (pJ) (i.e. 5 mW×4 ns). Controlling a laser at 5 mW is manageable because any impact from a lasing current threshold misestimation error is relatively small due to the relatively higher amount of laser output power being expended (i.e. with reference to FIG. 4A, the laser output is in the higher power region 425 far removed from the actual lasing current threshold 405).

Now, however, suppose the illumination energy value is set to 2.0 pJ with the same illumination time period of 4 ns. Here, the resulting laser power output would be 0.5 mW if a single pulse were used over the entire 4 ns illumination time period. While controlling a laser at 0.5 mW is achievable, the impact of any lasing current threshold misestimation is significantly higher than situations where the laser power is higher (e.g., 5 mW). With reference to FIG. 4A, a power output of 0.5 mW may cause the laser to operate in the lower power region 420. In some cases, turn-on delay also impacts the number of photons delivered, as described earlier. By following the disclosed principles, the turn-on delay is beneficially reduced, thereby achieving the benefits described earlier.

The disclosed embodiments are able to beneficially shift or modify from emitting a single pulse over the entire illumination time period to emitting one or more ultra-short pulses over the illumination time period. For instance, suppose the illumination time period for the pixel is still 4 ns and the illumination energy value is still 2.0 pJ. Now, instead of emitting a single laser pulse spanning all or a majority of the 4 ns, the disclosed embodiments emit one or more laser ultra-short pulses, where the pulse duration for those ultra-short laser pulses is significantly smaller (e.g., a small percentage) of the illumination time period. For instance, the pulse duration for an ultra-short laser pulse can be in the range of 0.4 nanoseconds to 3 nanoseconds. Furthermore, multiple laser pulses may be emitted during the illumination time period in such a manner so that the laser fully modulates in between each laser pulse. Notably, the number of laser pulses is dependent on the desired illumination energy value for the pixel, as will be described later.

To continue the example, the illumination energy value for the particular pixel is still 2.0 pJ and the illumination time period is still 4 ns. Instead of emitting a single laser pulse that spans the 4 ns, the disclosed embodiments emit one or more ultra-short laser pulses. As an example, suppose the individual laser pulse's pulse width/duration is modified to now be 0.5 ns. In this case, it is possible to operate the laser at a power level that is 8 times the previous power level while still achieving the same illumination energy value.

For instance, the modified power level of the laser is now set to 4 mW, where 4 mW×0.5 ns=2.0 pJ and the desired illumination energy value is achieved. With reference to FIGS. 4A and 4B, the laser is now operating in the higher power region 425 (e.g., 4 mW as opposed to 0.5 mW), and any misestimations 445 in the actual lasing current threshold 405 will have a relatively smaller impact as compared to when the laser was operating in the lower power region 420.

Another benefit of operating the laser using ultra-short laser pulses by operating at higher power regions is that the turn on delay of the laser is reduced. For instance, with reference to graph 430 in FIG. 4A, by operating at a higher power level (i.e. higher current levels on the graph), graph 430 shows that the turn on delay is beneficially reduced. A shorter turn on enables a greater number of ultra-short pulses or even a higher resolution image.

As indicated earlier, it should again be noted that the pixel intensity/brightness perceived by a user's eye while using the mixed-reality system is not the power level of the laser. Instead, the pixel intensity/brightness is related to the total illumination energy of the pixel (e.g., the 2.0 pJ discussed earlier). In this regard, the total illumination energy is the controlling factor in viewing pixel intensity/brightness.

By operating with shorter (i.e. ultra-short) laser pulse widths, it allows the embodiments to not only achieve a broader spectral linewidth (which reduces undesired visual artifacts), but it also allows the embodiments to operate the lasers at higher power levels, which is ideal for laser controllability and to reduce the impact of any lasing current threshold misestimations.

For relatively higher illumination energy values (e.g., bright and colored pixels), it is beneficial to use multiple pulses that have shorter pulse durations. Using multiple pulses for relatively higher illumination energy values allows the embodiments to still emit ultra-short pulses while still achieving the desired number of joules (i.e. the illumination energy value). For relatively lower illumination energy values (e.g., relatively dim pixels), it is beneficial to reduce the number of pulses and operate with smaller pulse durations. In this regard, the number of pulses and the pulse durations used to illuminate a pixel (according to the disclosed embodiments) are based on or dependent on the desired illumination energy value for that pixel.

Figure 9A:
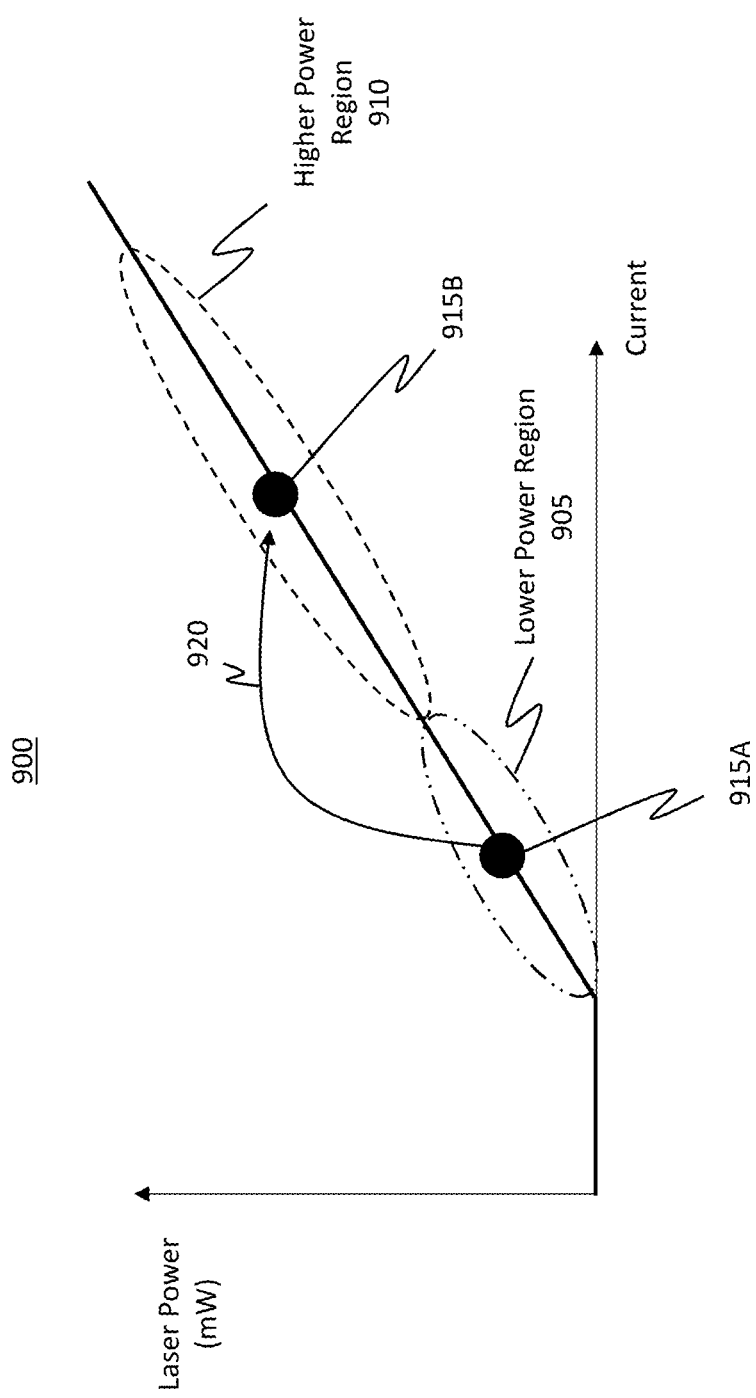
FIG. 9A illustrates how a laser's output power can be modified so that the laser operates in a higher power region. Operating at the higher power region allows the laser to have less error in the actual vs. expected output power in the presence of threshold current and slope efficiency estimation errors.

Attention will now be directed to FIG. 9A, which illustrates another graph 900 plotting laser power versus drive/pump current, which is similar to the graph 400 of FIG. 4A. Graph 900 shows a lower power region 905, which is representative of lower power region 420 from FIG. 4A, and higher power region 910, which is representative of higher power region 425 from FIG. 4A. In accordance with the principles disclosed herein, the disclosed embodiments are effectively able to move 920, change, or otherwise modify an initial power output 915A of the laser from being in the lower power region 905 to a modified higher power output 915B that is now in the higher power region 910. This movement is achieved by reducing the pulse duration of a laser pulse that is emitted during a pixel's illumination time period. In other words, the disclosed embodiments shorten the pulse duration of the resulting laser light, which results is a broader spectral linewidth and which results in the laser operating in the higher power region 910. By operating in the higher power region 910, the embodiments also reduce the impact of any lasing current threshold misestimation calculations and also reduce the turn-on delay of the laser.

Figure 9B:
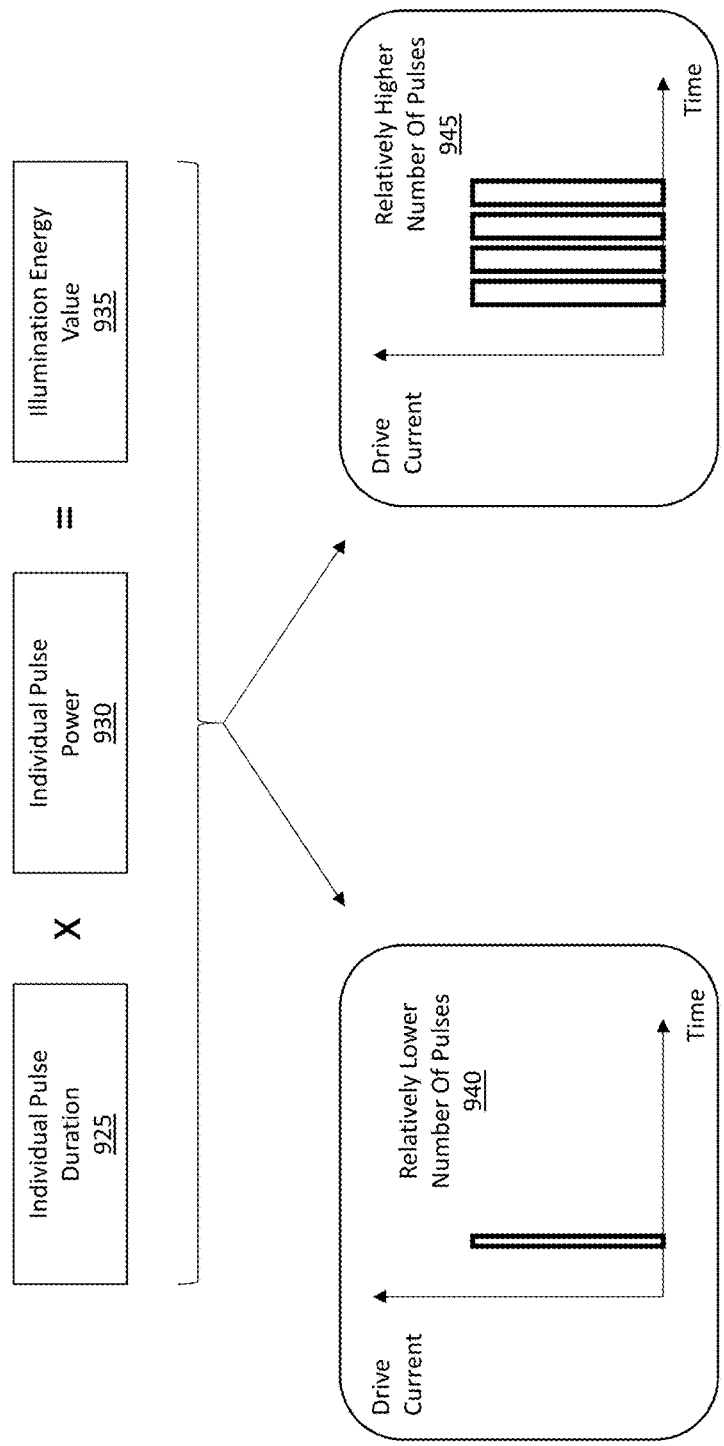
FIG. 9B illustrates how the number of laser pulses can be based on a function of the desired illumination energy for a pixel, and in particular how a relatively higher number of laser pulses can be emitted for higher illumination energies and how a relatively lower number of laser pulses can be emitted for lower illumination energies. In some cases, the pulse width can also be used to modulate the device.

FIG. 9B further shows how the individual pulse duration 925 multiplied by the individual pulse power 930 of a laser results in determining a pixel's illumination energy value 935. For lower illumination energy values, the embodiments operate using a relatively lower number of pulses 940 (while beneficially decreasing pulse duration and increasing laser output pulse power). For higher illumination energy values, the embodiments operate using a relatively higher number of pulses 945 (while beneficially decreasing pulse duration and increasing laser output pulse power, but by also operating using multiple pulses to achieve the higher illumination energy value). As stated earlier, using multiple pulses for higher illumination energy values enables the system to still obtain the higher illumination energy values even while operating at ultra-short pulse durations. That is, the combination of the multiple pulse's higher laser output pulse powers results in achieving the higher illumination energy value.

Estimating Laser Operational Characteristics

Figure 10A:
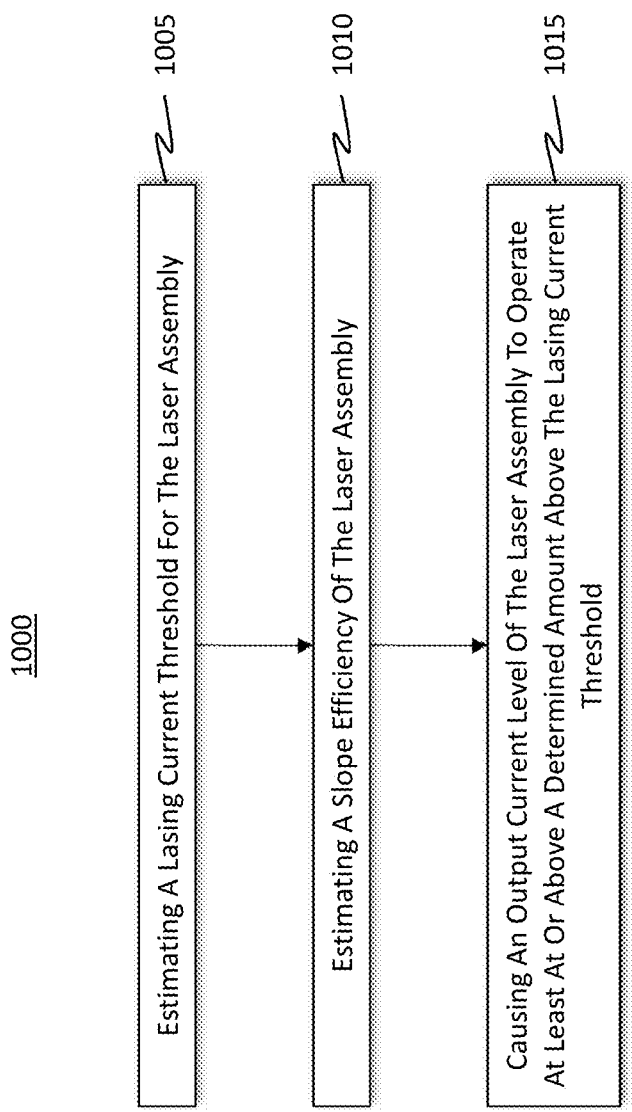
FIG. 10A illustrates a flowchart of an example method for estimating the lasing current threshold for a laser assembly.

FIG. 10A illustrates a flowchart of an example method 1000 for estimating some of the laser characteristics of a laser. For instance, as discussed earlier, the amount of misestimation that occurs when determining lasing current threshold can play a significant impact on how the laser is controlled. Method 1000 illustrates an example technique for performing these calculations and potentially identifying these errors.

Figure 10B:
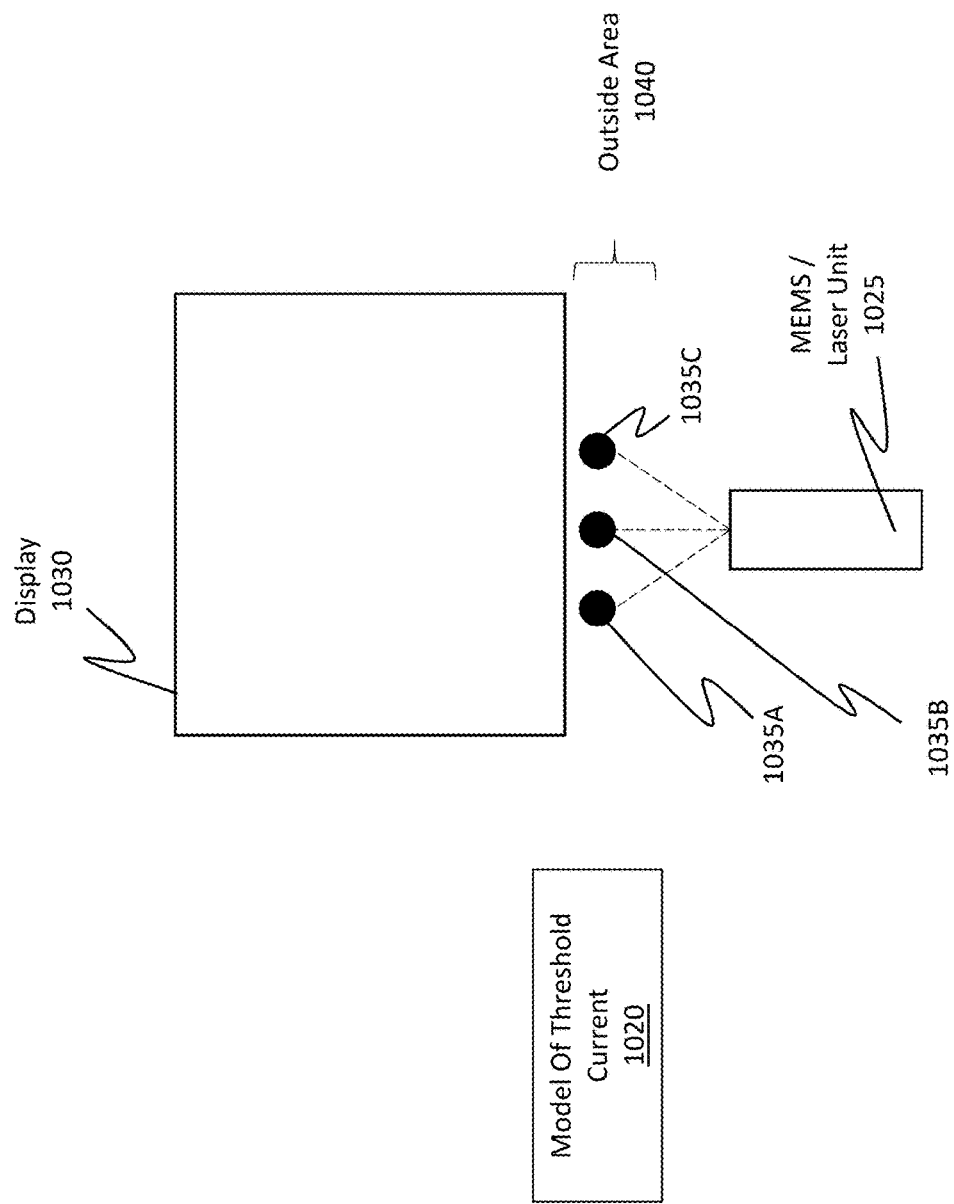
FIG. 10B illustrates an example technique for estimating the lasing current threshold of a laser assembly by emitting a number of calibration laser pulses at an area outside of a display area.

Initially, method 1000 includes an act 1005 of estimating a lasing current threshold for the laser assembly. FIG. 10B shows an example process for generating a model of lasing current threshold 1020. This model of lasing current threshold 1020 can be used to estimate the lasing current threshold for the laser assembly/emitter.

Specifically, FIG. 10B shows a MEMS/laser unit 1025, which is representative of the MEMS/laser units discussed earlier. FIG. 10B also shows a display 1030 (though a waveguide scanning system could be used as well). To estimate lasing current threshold, the MEMS/laser unit 1025 illuminates pixel areas (e.g., pixels 1035A, 1035B, and 1035C) at an outside area 1040 of the display 1030 so that the user will not see these illuminated pixel areas. These emissions or illuminations constitute calibration laser pulses and the user need not see these calibration laser pulses.

In this regard, estimating the lasing current threshold includes illuminating an area outside of a display area of the display system with one or more calibration laser pulses. By emitting calibration laser pulses, where the laser power output of the calibration laser pulses is selected to be near an anticipated value for the lasing current threshold, the embodiments can measure the laser power output and generate an estimation regarding the lasing current threshold. As such, estimating the lasing current threshold is based on a measurement of the calibration laser pulses and an attempt to emit laser light having a drive/pump current as close to the lasing current threshold as possible.

Returning to FIG. 10A, method 1000 then includes an act 1010 of estimating a slope efficiency of the laser assembly (e.g., the slope efficiencies discussed earlier in connection with FIGS. 4A and 4B). For instance, with reference to FIG. 9A, the solid line shown in graph 900 represents the slope efficiency of the laser emitter, as described in the earlier figures.

Method 1000 then includes act 1015 of causing an output current level of the laser (i.e. the laser assembly/emitter) to operate at least at or above a determined amount (or threshold amount) above the lasing current threshold. For instance, with reference again to FIG. 9A, by estimating the lasing current threshold (i.e. the transition point on the graph from being horizontal to being angled), the embodiments are able to attempt to operate the laser at or above the lasing current threshold. Further, in accordance with the disclosed principles, the embodiments cause the laser to operate in the higher power region 910, which is a determined amount above the lasing current threshold. By performing the disclosed principles, in which the laser is caused to operate at higher power output levels and with ultra-short laser pulses, any impact of a misestimation in the model or estimation of lasing current threshold can be reduced with regard to the performance of the laser.

Accordingly, in at least some embodiments, one or more different modifications may be made on both the pulse duration of a laser and on the output power of a laser. In some embodiments, one or more modifications may also be made on the estimated lasing current threshold, where these modifications are performed in response to feedback that is collected on the laser's performance. That is, feedback may be collected regarding where the actual lasing current threshold is located. Some embodiments are able to dynamically adjust their models or estimations regarding the lasing current threshold so as to reduce an misestimations or miscalculations. As such, some embodiments are able to attempt to modify or further correct any estimations in lasing current threshold and attempt to even further reduce any impacts misestimations may have on the laser's performance.

Accordingly, the disclosed embodiments are able to dynamically alter how many laser pulses are emitted during a particular time period, are able to dynamically alter the pulse durations for these laser pulses to achieve ultra-short durations, and are able to dynamically modify the laser's output power for each one of the pulses. In doing so, the disclosed embodiments are able to beneficially achieve a broader spectral linewidth for the resulting laser light and are able to better control the laser emitter/assembly.

Example Computer System(s)

Figure 11:
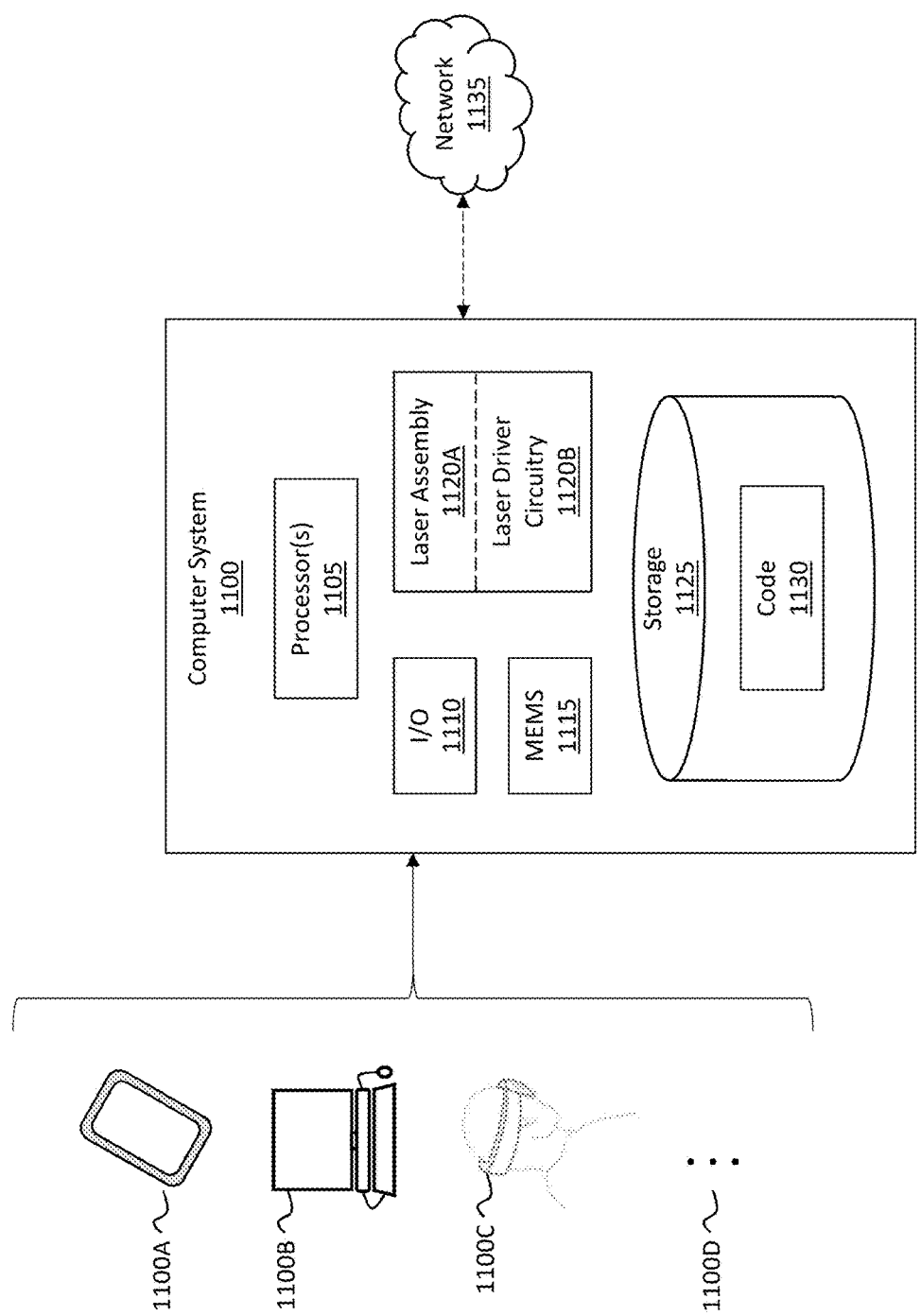
FIG. 11 illustrates an example computer system configured to perform the disclosed operations.

Attention will now be directed to FIG. 11 which illustrates an example computer system 1100 that may be used to facilitate the disclosed methods and/or that may comprise one of the disclosed systems. It will be appreciated that computer system 1100 may be configured within various form factors. For example, computer system 1100 may be embodied as a tablet 1100A, a desktop 1100B, or a HMD 1100C. The ellipsis 1100D demonstrates that computer system 1100 may be embodied in various other forms too. For instance, computer system 1100 may also be a distributed system that includes one or more connected computing components/devices that are in communication with computer system 1100, a laptop computer, a mobile phone, a server, a data center, and/or any other computer system. The ellipsis 1100D also indicates that other system subcomponents may be included or attached with the computer system 1100, including, for example, sensors that are configured to detect sensor data such as user attributes (e.g., heart rate sensors), as well as sensors like cameras and other sensors that are configured to detect sensor data such as environmental conditions and location/positioning (e.g., clocks, pressure sensors, temperature sensors, gyroscopes, accelerometers and so forth), all of which sensor data may comprise different types of information used during application of the disclosed embodiments.

In its most basic configuration, computer system 1100 includes various different components. For example, FIG. 11 shows that computer system 1100 includes at least one processor 1105 (aka a "hardware processing unit"), input/output ("I/O") 1110, a MEMS mirror system 1115, a laser assembly 1120A with laser driver circuitry 1120B, and storage 1125.

Computer system 1100 may also include a depth engine which includes any type of 3D sensing hardware to scan and generate a spatial mapping of an environment. For instance, the depth engine may include any number of time of flight cameras, stereoscopic cameras, and/or depth cameras. Using these cameras, the depth engine is able to capture images of an environment and generate a 3D representation of that environment. Accordingly, depth engine includes any hardware and/or software components necessary to generate a spatial mapping (which may include depth maps, 3D dot/point clouds, and/or 3D meshes).

Storage 1125 is shown as including executable code/instructions 1130. Storage 1125 may be physical system memory, which may be volatile, non-volatile, or some combination of the two. The term "memory" may also be used herein to refer to non-volatile mass storage such as physical storage media. If computer system 1100 is distributed, the processing, memory, and/or storage capability may be distributed as well. As used herein, the term "executable module," "executable component," or even "component" can refer to software objects, routines, or methods that may be executed on computer system 1100. The different components, modules, engines, and services described herein may be implemented as objects or processors that execute on computer system 1100 (e.g. as separate threads).

The disclosed embodiments may comprise or utilize a special-purpose or general-purpose computer including computer hardware, such as, for example, one or more processors (such as processor 1105) and system memory (such as storage 1125), as discussed in greater detail below. Embodiments also include physical and other computer-readable media for carrying or storing computer-executable instructions and/or data structures. Such computer-readable media can be any available media that can be accessed by a general-purpose or special-purpose computer system. Computer-readable media that store computer-executable instructions in the form of data are physical computer storage media. Computer-readable media that carry computer-executable instructions are transmission media. Thus, by way of example and not limitation, the current embodiments can comprise at least two distinctly different kinds of computer-readable media: computer storage media and transmission media.

Computer storage media are hardware storage devices, such as RAM, ROM, EEPROM, CD-ROM, solid state drives (SSDs) that are based on RAM, Flash memory, phase-change memory (PCM), or other types of memory, or other optical disk storage, magnetic disk storage or other magnetic storage devices, or any other medium that can be used to store desired program code means in the form of computer-executable instructions, data, or data structures and that can be accessed by a general-purpose or special-purpose computer.

Computer system 1100 may also be connected (via a wired or wireless connection) to external sensors (e.g., one or more remote cameras, accelerometers, gyroscopes, acoustic sensors, magnetometers, etc.). Further, computer system 1100 may also be connected through one or more wired or wireless networks 1135 to remote systems(s) that are configured to perform any of the processing described with regard to computer system 1100.

During use, a user of computer system 1100 is able to perceive information (e.g., a mixed-reality environment) through a display screen that is included with the I/O 1110 of computer system 1100 and that is visible to the user. The I/O interface(s) and sensors with the I/O 1110 also include gesture detection devices, eye trackers, and/or other movement detecting components (e.g., cameras, gyroscopes, accelerometers, magnetometers, acoustic sensors, global positioning systems ("GPS"), etc.) that are able to detect positioning and movement of one or more real-world objects, such as a user's hand, a stylus, and/or any other object(s) that the user may interact with while being immersed in the scene.

A graphics rendering engine may also be configured, with processor 1105, to render one or more virtual objects within a mixed-reality scene/environment. As a result, the virtual objects accurately move in response to a movement of the user and/or in response to user input as the user interacts within the virtual scene.

The laser assembly 1120A is representative of the laser assemblies/emitters discussed earlier. The laser driver circuitry 1120B is operable to drive/pump the laser with current in order to generate laser light. Accordingly, the laser assembly 1120A and laser driver circuitry 1120B are able to perform any of the disclosed operations related to operating the laser.

A "network," like the network 1135 shown in FIG. 11, is defined as one or more data links and/or data switches that enable the transport of electronic data between computer systems, modules, and/or other electronic devices. When information is transferred, or provided, over a network (either hardwired, wireless, or a combination of hardwired and wireless) to a computer, the computer properly views the connection as a transmission medium. Computer system 1100 will include one or more communication channels that are used to communicate with the network 1135. Transmissions media include a network that can be used to carry data or desired program code means in the form of computer-executable instructions or in the form of data structures. Further, these computer-executable instructions can be accessed by a general-purpose or special-purpose computer. Combinations of the above should also be included within the scope of computer-readable media.

Upon reaching various computer system components, program code means in the form of computer-executable instructions or data structures can be transferred automatically from transmission media to computer storage media (or vice versa). For example, computer-executable instructions or data structures received over a network or data link can be buffered in RAM within a network interface module (e.g., a network interface card or "NIC") and then eventually transferred to computer system RANI and/or to less volatile computer storage media at a computer system. Thus, it should be understood that computer storage media can be included in computer system components that also (or even primarily) utilize transmission media.

Computer-executable (or computer-interpretable) instructions comprise, for example, instructions that cause a general-purpose computer, special-purpose computer, or special-purpose processing device to perform a certain function or group of functions. The computer-executable instructions may be, for example, binaries, intermediate format instructions such as assembly language, or even source code. Although the subject matter has been described in language specific to structural features and/or methodological acts, it is to be understood that the subject matter defined in the appended claims is not necessarily limited to the described features or acts described above. Rather, the described features and acts are disclosed as example forms of implementing the claims.

Those skilled in the art will appreciate that the embodiments may be practiced in network computing environments with many types of computer system configurations, including personal computers, desktop computers, laptop computers, message processors, hand-held devices, multi-processor systems, microprocessor-based or programmable consumer electronics, network PCs, minicomputers, mainframe computers, mobile telephones, PDAs, pagers, routers, switches, and the like. The embodiments may also be practiced in distributed system environments where local and remote computer systems that are linked (either by hardwired data links, wireless data links, or by a combination of hardwired and wireless data links) through a network each perform tasks (e.g. cloud computing, cloud services and the like). In a distributed system environment, program modules may be located in both local and remote memory storage devices.

Additionally, or alternatively, the functionality described herein can be performed, at least in part, by one or more hardware logic components (e.g., the processor 1105). For example, and without limitation, illustrative types of hardware logic components that can be used include Field-Programmable Gate Arrays (FPGAs), Program-Specific or Application-Specific Integrated Circuits (ASICs), Program-Specific Standard Products (ASSPs), System-On-A-Chip Systems (SOCs), Complex Programmable Logic Devices (CPLDs), Central Processing Units (CPUs), and other types of programmable hardware.

The present invention may be embodied in other specific forms without departing from its spirit or characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A method of operating a display system that includes a microelectromechanical scanning (MEMS) mirror system and a laser assembly, the display system causing pixels of an image frame to be illuminated, where each pixel in the image frame is illuminated with one or more laser pulse(s) that are provided by the laser assembly and that are aimed by the MEMS mirror system and in which multiple pixels are combined to form the image frame, the method comprising:
    determining an illumination energy value for a pixel;
    determining an illumination time period for the pixel during which the pixel is permitted to be illuminated with laser light generated by the laser assembly;
    determining a number of laser pulses that are to be emitted by the laser assembly to achieve the illumination energy value during the illumination time period, wherein the number of laser pulses is based on the illumination energy value for the pixel; and
    within the illumination time period and in accordance with the determined number of laser pulses, illuminating the pixel with the laser light by causing the laser assembly to emit one or more laser pulse(s) that are directed towards the pixel by the MEMS mirror system and that cause the pixel to be illuminated at the illumination energy value.

2. The method of claim 1, wherein the illumination time period is between 3 nanoseconds and 15 nanoseconds.

3. The method of claim 1, wherein a relatively larger illumination energy value for the pixel results in a relatively higher number of laser pulses being emitted during the illumination time period while a relatively lower illumination energy value for the pixel results in a relatively lower number of laser pulses being emitted during the illumination time period.

4. The method of claim 1, wherein a laser pulse duration of the one or more laser pulse(s) is between 0.4 nanoseconds and 3 nanoseconds, and wherein a spectral linewidth of the one or more laser pulse(s) is increased as the pulse duration is decreased.

5. The method of claim 1, wherein a pulse width of the one or more laser pulse(s) is adjustable and is dependent on the illumination energy value.

6. The method of claim 1, wherein the method further includes:
    estimating a lasing current threshold for the laser assembly;
    estimating a slope efficiency of the laser assembly; and
    causing an output current level of the laser assembly to operate at least at or above a determined amount above the lasing current threshold.

7. A method for reducing an impact of a lasing current threshold misestimation error of a laser assembly by selectively controlling how many laser pulses the laser assembly emits to illuminate a particular pixel, the laser assembly being included within a display system that includes a microelectromechanical scanning (MEMS) mirror system, the display system causing pixels of an image frame to be illuminated, where each pixel in the image frame is illuminated with one or more laser pulse(s) that are provided by the laser assembly and that are aimed by the MEMS mirror system to form the image frame, the method comprising:

determining an illumination energy value for a pixel of the image frame;

determining an illumination time period for the pixel, the illumination time period defining a maximum period of time during which the pixel is permitted to be illuminated by the laser assembly;

determining a number of laser pulses that are to be emitted by the laser assembly to illuminate the pixel during the illumination time period, wherein:

the number of laser pulses is based on the illumination energy value for the pixel, and a relatively larger illumination energy value for the pixel results in a relatively higher number of laser pulses being emitted during the illumination time period while a relatively lower illumination energy value for the pixel results in a relatively lower number of laser pulses being emitted during the illumination time period; and within the illumination time period and in accordance with the determined number of laser pulses, illuminating the pixel by causing the laser assembly to emit one or more laser pulse(s) that are directed towards the pixel by the MEMS mirror system and that cause the pixel to be illuminated at the illumination energy value.

8. The method of claim 7, wherein the illumination time period is between 3 nanoseconds and 15 nanoseconds, and wherein the number of laser pulses is between 1 and 10.

9. The method of claim 7, wherein a spectral linewidth of the one or more laser pulse(s) is between 2 nanometers and 10 nanometers, and wherein the spectral linewidth increases as a pulse duration of the one or more laser pulse(s) decreases.

10. The method of claim 7, wherein a coherence level associated with the laser assembly is a reduced coherence level occurring as a result of the laser assembly emitting the one or more laser pulse(s) during the illumination time period as opposed to continuously emitting a continuous laser pulse during the illumination time period.

11. The method of claim 7, wherein a pulse duration of the one or more laser pulse(s) is between 0.4 nanoseconds and 3 nanoseconds, and wherein a spectral linewidth of the one or more laser pulse(s) increases as the pulse duration decreases.

12. The method of claim 7, wherein causing the laser assembly to emit the one or more laser pulse(s) includes causing the laser assembly to emit multiple laser pulses such that multiple pulses of laser light illuminate the pixel during the illumination time period.

13. The method of claim 12, wherein illuminating the pixel with the multiple laser pulses includes causing the laser assembly to fully modulate for each one of the multiple laser pulses.

14. The method of claim 7, wherein the image frame is illuminated by two separate laser emitters, and wherein the two separate laser emitters concurrently illuminate corresponding pixels.

15. The method of claim 7, wherein the image frame is illuminated by two separate laser emitters, and wherein the two separate laser emitters stagger when pixels are illuminated.

16. A method for increasing spectral linewidth of laser light emitted by a laser assembly, the laser assembly being included within a display system that includes a microelectromechanical scanning (MEMS) mirror system, the display system causing pixels of an image frame to be illuminated, where each pixel in the image frame is illuminated with one or more laser pulse(s) that are provided by the laser assembly and that are aimed by the MEMS mirror system to form the image frame, the method comprising:

determining an illumination energy value for a pixel of the image frame;

determining an illumination time period for the pixel, the illumination time period defining a maximum period of time during which the pixel is permitted to be illuminated by the laser assembly;

determining a number of laser pulses that are to be emitted by the laser assembly to illuminate the pixel during the illumination time period, wherein:

the number of laser pulses is based on the illumination energy value for the pixel, and a spectral linewidth of the laser pulses is set to at least a determined value by limiting pulse durations for the laser pulses; and within the illumination time period and in accordance with the determined number of laser pulses, illuminating the pixel by causing the laser assembly to emit one or more laser pulse(s) that are directed towards the pixel by the MEMS mirror system and that cause the pixel to be illuminated at the illumination energy value, wherein corresponding spectral linewidths for the one or more laser pulse(s) are set to at least the determined value.

17. The method of claim 16, wherein the method further includes generating a model that estimates a lasing current threshold for the laser assembly.

18. The method of claim 17, wherein estimating the lasing current threshold includes:

illuminating an area outside of a display area of the display system with one or more calibration laser pulses; and estimating the lasing current threshold based on a measurement of the one or more calibration laser pulses.

19. The method of claim 16, wherein a pulse duration of the one or more laser pulse(s) is between 0.4 nanoseconds and 3 nanoseconds.

20. The method of claim 16, wherein a spectral linewidth of the one or more laser pulse(s) is between 2 nanometers and 10 nanometers.

* * * * *